US010152380B2

(12) United States Patent
Yim et al.

(10) Patent No.: US 10,152,380 B2
(45) Date of Patent: Dec. 11, 2018

(54) MEMORY DEVICE, MEMORY SYSTEM, AND METHOD OF OPERATING MEMORY DEVICE

(71) Applicant: Samsung Electronics Co., Ltd., Suwon-si, Gyeonggi-do (KR)

(72) Inventors: Hye-jin Yim, Wonju-si (KR); Seung-jae Lee, Hwaseong-si (KR); Il-han Park, Suwon-si (KR); Kang-bin Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/385,124

(22) Filed: Dec. 20, 2016

(65) Prior Publication Data

US 2017/0308438 A1 Oct. 26, 2017

(30) Foreign Application Priority Data

Apr. 21, 2016 (KR) ........................ 10-2016-0048952

(51) Int. Cl.
| | | |
|---|---|---|
| *G11C 11/56* | (2006.01) | |
| *G06F 11/14* | (2006.01) | |
| *G11C 16/26* | (2006.01) | |
| *G11C 16/34* | (2006.01) | |

(52) U.S. Cl.
CPC .......... *G06F 11/1402* (2013.01); *G11C 16/26* (2013.01); *G11C 16/349* (2013.01); *G06F 2201/805* (2013.01); *G06F 2201/82* (2013.01)

(58) Field of Classification Search
None
See application file for complete search history.

(56) References Cited

U.S. PATENT DOCUMENTS

| | | | |
|---|---|---|---|
| 4,977,596 A * | 12/1990 | Maestas | .................... H04L 9/12 |
| | | | 370/503 |
| 7,679,133 B2 | 3/2010 | Son et al. | |
| 7,936,601 B2 | 5/2011 | Kang et al. | |
| 8,154,921 B2 | 4/2012 | Mokhlesi et al. | |
| 8,553,466 B2 | 10/2013 | Han et al. | |
| 8,559,235 B2 | 10/2013 | Yoon et al. | |
| 8,576,624 B2 | 11/2013 | Dutta et al. | |
| 8,654,587 B2 | 2/2014 | Yoon et al. | |
| 8,839,073 B2 | 9/2014 | Cohen | |
| 8,953,373 B1 | 2/2015 | Wu et al. | |
| 9,076,545 B2 | 7/2015 | Mokhlesi | |
| 9,111,626 B2 | 8/2015 | Kim et al. | |
| 9,502,129 B1 * | 11/2016 | Suzuki | ............... G11C 16/3431 |
| 2009/0327803 A1 | 12/2009 | Fukutomi et al. | |
| 2010/0091535 A1 | 4/2010 | Sommer et al. | |
| 2010/0100794 A1 * | 4/2010 | Tang | .................... G06F 11/1068 |
| | | | 714/763 |
| 2011/0233648 A1 | 9/2011 | Seol et al. | |

(Continued)

*Primary Examiner* — Son Dinh
*Assistant Examiner* — Sultana Begum
(74) *Attorney, Agent, or Firm* — Harness, Dickey & Pierce, P.L.C.

(57) ABSTRACT

A memory device includes a memory cell array including a plurality of memory cells; a counting circuit configured to obtain a counting result by performing a counting operation on data read from the plurality of memory cells; and a control logic configured to perform a data restoring operation based on the counting result without involvement of a memory controller.

16 Claims, 29 Drawing Sheets

(56) References Cited

U.S. PATENT DOCUMENTS

| | | |
|---|---|---|
| 2013/0094290 A1 | 4/2013 | Sridharan et al. |
| 2014/0063940 A1 | 3/2014 | Chen et al. |
| 2014/0281770 A1* | 9/2014 | Kim .................... G06F 11/1068 714/721 |
| 2014/0376312 A1 | 12/2014 | Song et al. |
| 2015/0039842 A1 | 2/2015 | Fitzpatrick et al. |
| 2015/0154064 A1 | 6/2015 | Ghaly et al. |
| 2015/0262714 A1 | 9/2015 | Tuers et al. |
| 2016/0035417 A1* | 2/2016 | Park ..................... G11C 13/004 365/148 |
| 2017/0092361 A1* | 3/2017 | Kang ................. G11C 16/0466 |

* cited by examiner

MEMORY DEVICE, MEMORY SYSTEM, AND METHOD OF OPERATING MEMORY DEVICE

CROSS-REFERENCE TO RELATED APPLICATION

This application claims the benefit of Korean Patent Application No. 10-2016-0048952, filed on Apr. 21, 2016, in the Korean Intellectual Property Office, the disclosure of which is incorporated herein in its entirety by reference.

BACKGROUND

At least one example embodiment of the inventive concepts relates to a memory device, and more particularly, to a nonvolatile memory device and a memory system including the nonvolatile memory device.

Memory devices are used to store data, and may be divided into volatile memory devices and nonvolatile memory devices. Volatile memory devices lose their stored data when power supply is interrupted. However, nonvolatile memory devices retain data even when power supply is interrupted.

A flash memory system, which is an example of the nonvolatile memory device, is widely used in, for example, a Universal Serial Bus (USB) drive, a digital camera, a mobile phone, a smartphone, a tablet, a personal computer (PC), a memory card or a solid state drive (SSD).

Threshold voltages of multiple programmed memory cells included in a nonvolatile memory device may change for various reasons such as retention, floating gate coupling, or charge loss over time. Such changes may degrade reliability of read data. Changes in threshold voltages for various reasons as described above will be referred to as 'degradation' below.

SUMMARY

At least one example embodiment of the inventive concepts provides a memory device in which data restoring operation is performed in the memory device if an uncorrectable error is generated in data, and a memory system including the memory device.

According to at least some example embodiments of the inventive concepts, there is provided a memory device including: a memory cell array including a plurality of memory cells; a counting circuit configured to perform counting on data read from the plurality of memory cells to provide a counting result; and a control logic configured to perform a data restoring operation based on the counting result of the counting circuit without involvement of a memory controller.

According to at least some example embodiments of the inventive concepts, there is provided a memory system including: a memory device comprising a memory cell array including a plurality of memory cells, a counting circuit configured to perform counting on data read according to a normal read operation and provide a counting result, and a control logic configured to perform a data restoring operation based on the counting result of the counting circuit; and a memory controller configured to control the memory device, wherein the memory device outputs a ready/busy signal to the memory controller, and the busy state is maintained during a first section after the normal read operation based on the counting result.

According to at least some example embodiments of the inventive concepts, a memory device includes a memory cell array including a plurality of memory cells; a counting circuit configured to obtain a counting result by performing a counting operation on data read from the plurality of memory cells; and a control logic configured to perform a data restoring operation based on the counting result without involvement of a memory controller.

According to at least some example embodiments of the inventive concepts, a memory system includes a memory device comprising a memory cell array including a plurality of memory cells, a counting circuit configured to obtain a counting result by performing a counting operation on data read according to a normal read operation, and a control logic configured to perform a data restoring operation based on the counting result; and a memory controller configured to control the memory device, wherein the memory device outputs a ready/busy signal to the memory controller, and maintains a busy state based on the counting result, during a first section after the normal read operation.

According to at least some example embodiments of the inventive concepts, a memory system includes a memory device including a plurality of memory cells; and a memory controller, the memory controller configured to command the memory device and send the memory device a read command, the memory device configured to respond to the read command by, designating cells, from among the plurality of memory cells, having threshold voltages within one or more first threshold voltage distribution regions as degraded cells, determining a total number of the degraded cells, determining whether a number of errors in the plurality of memory cells exceeds an error threshold based on the determined total number and a first threshold value, and performing a data restoring operation in response to determining that that the number of errors in the plurality of memory cells exceeds the error threshold.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
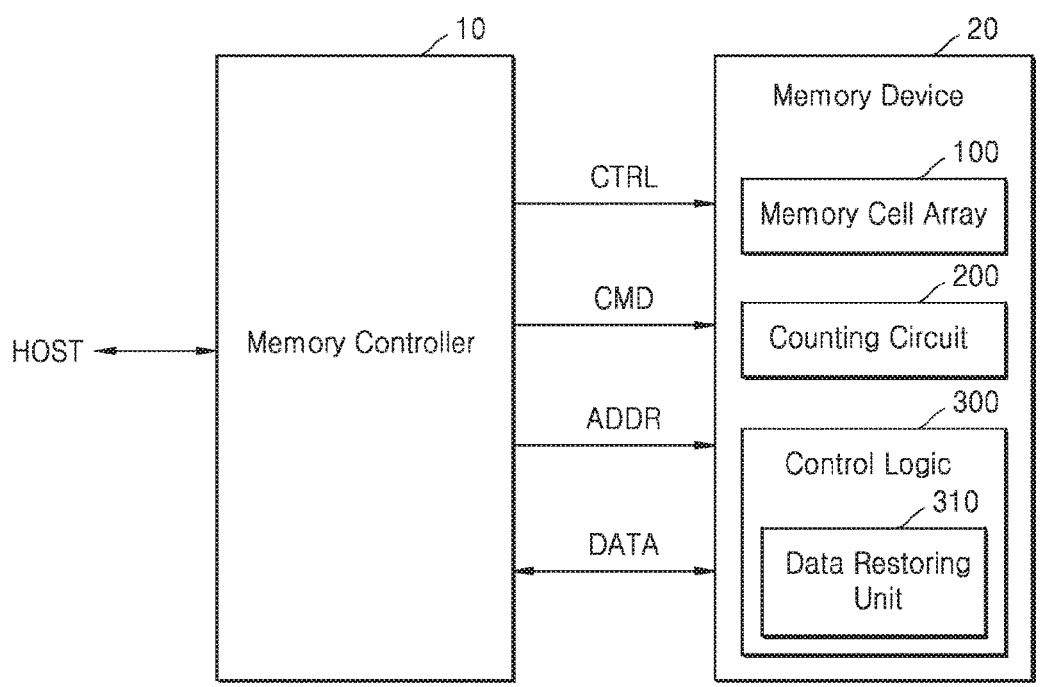
FIG. 1 is a schematic block diagram of a memory system according to at least some example embodiments of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a schematic block view of a memory system according to at least some example embodiments of the inventive concepts.

Referring to FIG. 1, the memory system may include a memory controller 10 and a memory device 20, and the memory device 20 may include a memory cell array 100, a counting circuit 200, and a control logic 300. The control logic 300 may include a data restoring unit 310.

In response to a write/read request from a host HOST, the memory controller 10 may read data stored in the memory device 20 or may control the memory device 20 to write data to the memory device 20. In more detail, the memory controller 10 may provide an address ADDR, a command CMD, and a control signal CTRL to the memory device 20 and thus may control a program (or write) operation, a read operation, and an erase operation with respect to the memory device 20. Also, write-target data DATA or read data DATA may be exchanged between the memory controller 10 and the memory device 20.

In addition, the memory controller 10 may communicate with an external host by using various standard interfaces. For example, the memory controller 10 may include a host interface (not shown), and the host interface may provide various standard interfaces between as host and the memory controller 10. Examples of the standard interfaces may include Advanced Technology Attachment (ATA), serial ATA (SATA), external SATA (e-SATA), Small Computer Small Interface (SCSI), serial attached SCSI (SAS), Peripheral Component Interconnection (PCI), PCI express (PCI-E), IEEE 1394, Universal Serial Bus (USB), a Secure Digital (SD) card, a Multi Media Card (MMC), an embedded Multi Media Card eMMC, a Universal Flash Storage (UFS), and a Compact Flash (CF) card interface.

The memory cell array 100 may include a plurality of memory cells, which may be, for example, flash memory cells. Hereinafter, description will focus on NAND flash memory cells as the plurality of memory cells. However, At least some example embodiments of the inventive concepts are not limited thereto, and in other embodiments, the plurality of memory cells may be resistive memory cells such as resistive random access memories (RAMs) (Re-RAMs), phase change RAMs (PRAMs) or magnetic/magnetoresistive RAMs (MRAMs).

In some embodiments, the memory cell array 100 may include a two-dimensional (2D) memory cell array and include a plurality of cell strings arranged in a row direction and a column direction, which will be described in detail with reference to FIG. 4. In some embodiments, the memory cell array 100 may include a three-dimensional (3D) memory cell array including a plurality of NAND strings. Each NAND string may include memory cells respectively connected to word lines that are vertically stacked on a substrate, which will be described in detail with reference to FIGS. 5 and 6.

The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

According to at least one example embodiment of the inventive concepts, the 3D memory array includes vertical NAND strings that are vertically oriented such that at least one memory cell is located over another memory cell. The at least one memory cell may comprise a charge trap layer. The following patent documents, which are hereby incorporated in their entirety by reference, describe suitable configurations for 3D memory arrays, in which 3D memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648. Also, US Pat. Pub. No. 2014/0376312 is incorporated herein in its entirety by reference.

The counting circuit 200 may count the number of memory cells of the memory cell array 100 based on data stored in a page buffer (not shown) which will be described later. In the present disclosure, the counting circuit 200 may count, particularly, the number of degraded cells DC. According to an embodiment, the function of the counting circuit 200 may also be performed by the control logic 300.

The control logic 300 may output various control signals for writing data to the memory cell array 100 or reading data from the memory cell array 100 or erasing data stored in the memory cell array 100, based on a command CMD, an address ADDR, and a control signal CTRL received from the memory controller 10. By doing so, the control logic 300 may generally control operations in the memory device 20.

The control logic 300 may include a data restoring unit 310. The data restoring unit 310 may perform a data restoring operation, without involvement of the memory controller 10, based on a counting result sent from the counting circuit 200. For example, the memory device 200 may perform a first read operation (for example, a normal read operation) on data according to a read commend from the memory controller 10. If an uncorrectable error (uncorrectable ECC, UECC) is generated in data read in the normal read operation, the data restoring unit 310 may restore the data through a restoration algorithm without involvement of the memory controller 10. Non-limiting examples of the restoration algorithm may include a data recover read, a soft decision data generation, which will be described in detail later. The control logic 300 may transmit restored data to the memory controller 10.

According to the above-described embodiment, the memory device 20 may determine whether data restoration is necessary based on an counting operation performed on the read data, perform a data restoring operation without involvement of the memory controller 10, and provide data obtained as a result of the data restoring operation as normal data to the memory controller 10. Accordingly, the memory controller 10 does not need to receive uncorrectable data from the memory device 20 and additionally transmit a command for data restoration to the memory device 20. In addition, after the memory device 20 has transmitted data with an uncorrectable error, a process of retransmitting restored data is not performed, and thus, data does not need to be transmitted twice. In addition, the memory controller 10 does not need to perform an error correcting code operation on data with an uncorrectable error.

Figure 2:
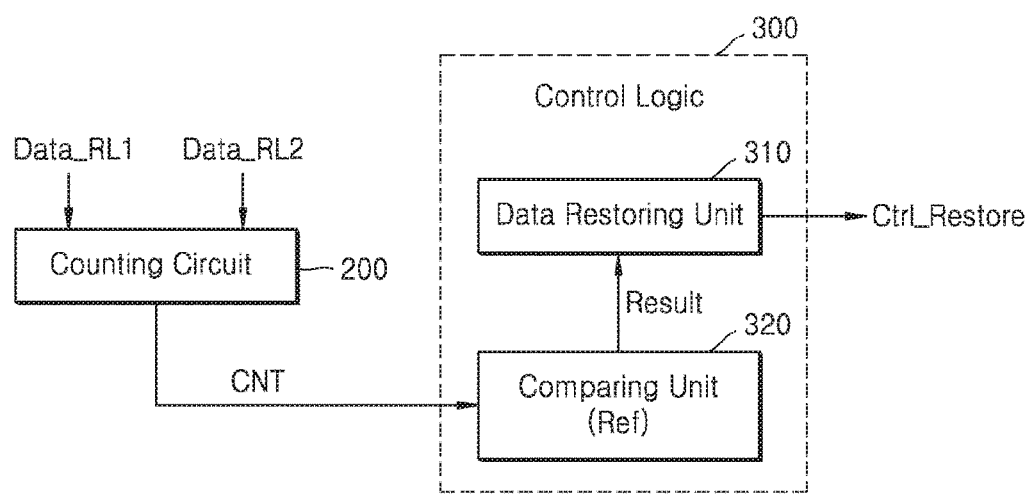
FIG. 2 is a partial block diagram of a memory device according to at least some example embodiments of the inventive concepts.

FIG. 2 is a partial block diagram of the memory device 20 according to at least some example embodiments of the inventive concepts.

Referring to FIG. 2, the control logic 300 may include the data restoring unit 310 and a comparing unit 320. The comparing unit 320 may store a reference value Ref. For example, the comparing unit 320 may store at least one reference value Ref. In addition, the counting circuit 200 may perform a counting operation based on first read level data Data_RL1 and second read level data Data_RL2, and output a counting result CNT to the comparing unit 320. The counting result CNT may correspond to the number of counted degraded cells, and a method of counting the same will be described in detail later. The functions of the data restoring unit 310 and comparing unit 320 may be implemented as hardware (e.g., dedicated circuitry and/or an application specific integrated circuit (ASIC)), a processor executing software (e.g., one or more processors included in, or, alternatively, embodying, the control logic 300 executing computer-executable instructions), or a combination of hardware and a processor executing software.

The term 'processor', as used in the present disclosure, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor; a multi-processor, an application-specific integrated circuit (ASIC), and a field programmable gate array (FPGA). Processors executing program code are programmed processors, and thus, are special-purpose computers.

When receiving the counting result CNT from the counting circuit 200, the comparing unit 320 may compare the counting result CNT with the reference value Ref and provide a comparison result Result with the reference value Ref to the control logic 300. The comparison result Result may include information indicating a degree of degradation of memory cells, and may include, for example, information indicating whether an uncorrectable error is generated in read data. According to at least some example embodiments of the inventive concepts, the comparing unit 320 may compare a reference value Ref, which may be an index of an uncorrectable error. For example, the comparing unit 320 may determine whether or not the reference value Ref corresponds to a number of bit errors that exceeds an error correction capability (e.g., an error correction capability of the memory device 20 and/or memory controller 10), with the counting result CNT, and if the counting result CNT is greater than the reference value Ref, the comparing unit 320 may output a comparison result Result of this to the data restoring unit 310.

Upon receiving the comparison result Result indicating that an uncorrectable error is generated, the data restoring unit 310 may output a restoration control signal Ctrl_Restore according to a preset or, alternatively, desired restoration algorithm. According to an embodiment, the restoration algorithm may include various types of restoration algorithms performed during a read retry operation when an uncorrectable error is generated in read data. As the restoration control signal Ctrl_Restore is provided to various blocks included in the memory device 20, a re-read operation which may reduce a data error ratio may be performed. Examples of the restoration algorithms will be described later.

According to an embodiment, the first read level data Data_RL1 and the second read level data Data_RL2 may represent results of data sensing (or data reading) based on different read levels. For example, when determining a level state of one of threshold voltage levels of memory cells, data may be read based on at least two read levels. The counting circuit 200 may perform a counting operation based on the first read level data Data_RL1 and the second read level data Data_RL2, and may count the number of memory cells (for example, degraded memory cells) having threshold voltages in a predetermined or, alternatively, desired distribution region (for example, in a distribution region between a first read level and a second read level).

According to an embodiment, the counting circuit 200 may respectively receive the first read level data Data_RL1 and the second read level data Data_RL2, and determine memory cells belonging to the above-described distribution region through an arithmetic operation on the first read level data Data_RL1 and the second read level data Data_RL2. For example, memory cells belonging to the above-described distribution region may be determined through an arithmetic operation such as XOR performed on the first read level data Data_RL1 and the second read level data Data_RL2, and a counting result CNT may be generated through a counting operation on the memory cells belonging to the distribution region.

Alternatively, according to another embodiment, an arithmetic operation such as XOR may be performed using a page buffer (not shown) that stores the first read level data and Data_RL1 the second read level data Data_RL2. In this case, the counting circuit 200 may receive data (or arithmetic data) provided by the page buffer, and generate a counting result CNT representing the number of counted memory cells belonging to the above distribution region according to a counting operation performed on the data.

Figure 3:
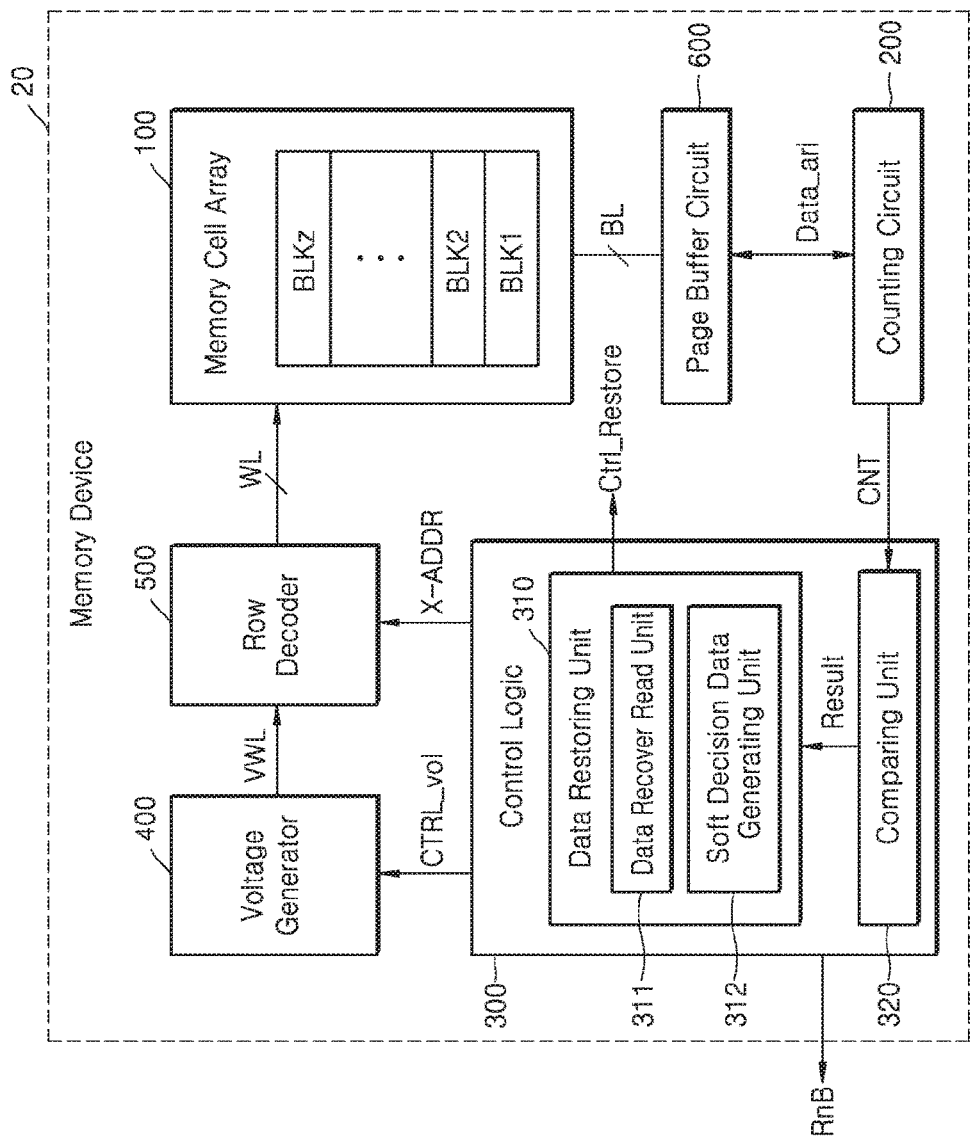
FIG. 3 is a block diagram of a memory device according to at least some example embodiments of the inventive concepts.

FIG. 3 is a block diagram of the memory device 20 according to at least some example embodiments of the inventive concepts.

Referring to FIGS. 1 through 3, the memory device 20 may include the memory cell array 100, the counting circuit 200, the control logic 300, a voltage generator 400, a row decoder 500, and a page buffer 600. Although not illustrated in FIG. 3, the memory device 20 may further include other functional blocks which may be implemented by circuits or circuitry and may be related to a memory operation, such as an input/output interface. Descriptions of elements provided above with reference to FIG. 1 will be omitted. According to at least some example embodiments of the inventive concepts, each of the control logic 300, voltage generator 400, and row decoder 500 may be embodied by circuits or circuitry.

The memory cell array 100 may include a plurality of memory cells, and the plurality of memory cells may be connected to word lines WL, a string selection line (not shown), a ground selection line (not shown), and bit lines BL. In detail, the memory cell array 100 may be connected to the row decoder 500 through the word lines WL, the string selection line, and the ground selection line, and connected to the page buffer 600 through the bit lines BL.

The memory cell array 100 may include a plurality of blocks BLK1 through BLKz, and each block may have a two-dimensional structure (or a planar structure) or a three-dimensional structure (or a vertical structure). The blocks BLK1 through BLKz may be selected by the row decoder 500. For example, the row decoder 500 may select a block corresponding to a block address among the blocks BLK1 through BLKz. The memory cell array 100 may include at least one of a single-level cell block including single level cells, a multi-level cell block including multi-level cells, and a triple level cell block including triple level cells. For example, some of the plurality of blocks BLK1 through BLKz included in the memory cell array 100 may be single-level cell blocks, and other blocks may be multi-level cell blocks or triple-level cell blocks.

Various internal control signals output from the control logic 300 may be provided to the voltage generator 400, the row decoder 500, and the page buffer 600. In detail, the control logic 300 may provide a voltage control signal CTRL_vol to the voltage generator 400. The voltage generator 400 may include at least one pump (not shown), and generate voltages of various levels based on a pumping operation based on a voltage control signal CTRL_vol.

Meanwhile, the control logic 300 may provide a row address X-ADDR to the row decoder 500 and a column address (not shown) to the page buffer 600. In addition, when data read through a sensing operation (or a read operation) is stored in the page buffer 600, the data of the page buffer 600 may be transmitted to an input/output buffer (not shown) in response to a control signal from the control logic 300. In addition, in response to an output enable signal from the control logic 300, data stored in the input/output buffer may be provided to the outside (for example, to a memory controller).

In addition, the control logic 300 may output a ready/busy signal RnB indicating a state of the memory device 20. When the memory device 20 provides a ready/busy signal RnB having a busy state to the memory controller 10, the memory controller 10 may not output a command during a busy state section. On the other hand, when the memory device 20 provides a ready/busy signal RnB having a ready state to the memory controller 10, the memory controller 10 may provide a command to the memory device 20 during a ready state section.

The counting circuit 200 may count degraded memory cells based on the data stored in the page buffer 600, and output the counting result CNT of the degraded memory cells to the comparing unit 320 of the control logic 300. As described above, the comparing unit 320 may receive the counting result CNT of the counting circuit 200 and compare the same with a reference value, and output a comparison result Result to the data restoring unit 310.

As described above, the counting circuit 200 may count degraded memory cells by using various methods. For example, FIG. 3 illustrates a counting operation performed by receiving arithmetic data Data_ari as a result of an arithmetic operation performed by using the first and second read level data Data_RL1 and Data_RL2.

The data restoring unit 310 may perform a restoration algorithm based on the comparison result Result of the comparing unit 320, and output a restoration control signal Ctrl_Restore to control internal components of the memory device 20 in regard to data recovery. For example, the data restoring unit 310 may include a data recover read unit 311 controlling a data recover read operation and/or a soft decision data generating unit 312 controlling generation of soft decision data. The functions of the data recover read unit 311 and the soft decision data generating unit 312 may be implemented as may be implemented as hardware (e.g., dedicated circuitry and/or an application specific integrated circuit (ASIC)), a processor executing software (e.g., one or more processors included in, or, alternatively, embodying, the control logic 300 executing computer-executable instructions), or a combination of hardware and a processor executing software. When implemented as software, the data recover read unit 311 and the soft decision data generating unit 312 may correspond to software (or programs) that are each executable by a processor.

According to an embodiment, the control logic 300 may control a state of the ready/busy signal RnB based on the comparison result Result. For example, if a restoration algorithm is to be performed, the control logic 300 may maintain the state of the ready/busy signal RnB (or a busy state of the ready/busy signal RnB) during a section in which the restoration algorithm is being performed, without changing the state of the ready/busy signal RnB (or without changing the state of the ready/busy signal RnB to a ready state), after a normal read operation is ended. That is, in addition to a section of the normal read operation, the ready/busy signal RnB may maintain its busy state based on the comparison result Result during additional sections related to generation of the comparison result Result and the operation of the restoration algorithm.

Figure 4:
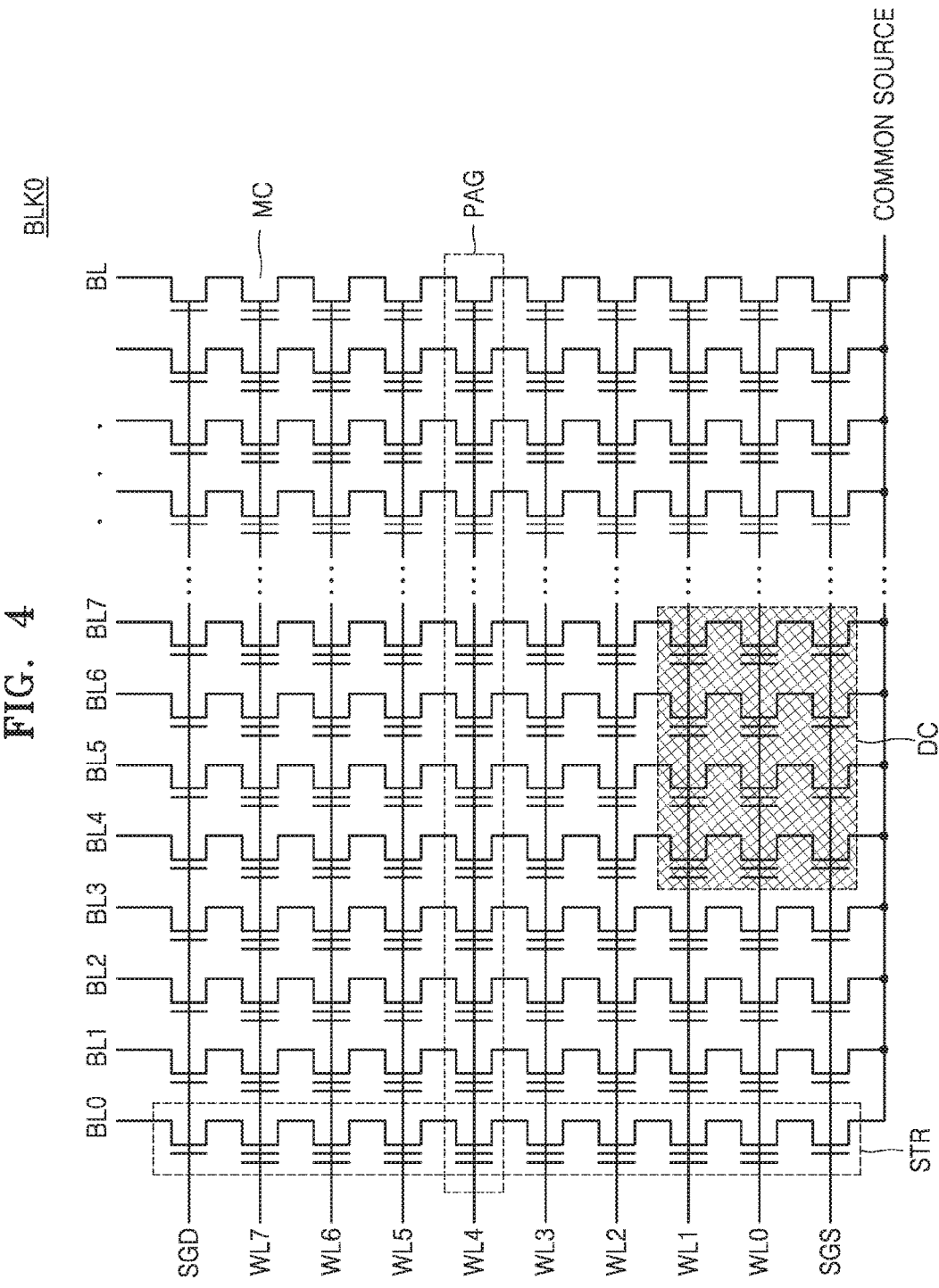
FIG. 4 is a circuit diagram illustrating an example of a memory block included in a memory cell array, according to at least some example embodiments of the inventive concepts.

FIG. 4 is a circuit diagram illustrating a memory block BLK0, which is an example of a memory block included in a memory cell array according to at least some example embodiments of the inventive concepts.

Referring to FIG. 4, the memory cell array (for example, the memory cell array 100 of FIG. 1) may be a memory cell array of a horizontal NAND flash memory and include a plurality of memory blocks. Each memory block BLK0 may include n (where n is an integer equal to or greater than 2) strings STR in which a plurality of memory cells MC are serially connected along bit lines BL0 through BLn−1. For example, each string STR includes eight memory cells in the embodiment of FIG. 4.

In the NAND flash memory device having a structure as illustrated in FIG. 4, erasing is performed on each block, and programming is performed in units of pages PAG respectively corresponding to word lines WL0 through WL7. According to the embodiment of FIG. 4, eight pages PAG corresponding to eight word lines WL0 through WL7 are included in one block. Alternatively, memory blocks of the memory cell array 100 according to at least some example embodiments of the inventive concepts may also include different numbers of memory cells and pages from those of the memory cells MC and the pages PG illustrated in FIG. 4. In addition, the memory device 20 of FIGS. 1 through 3 may include a plurality of memory cell arrays each having the same structure and performing the same operation as the memory cell array 100 described above.

Due to the characteristics of the memory cells MC, repeated writing (programming) and erasing may cause degradation of the memory cells MC. Memory cells MC are degraded due to retention, disturb or the like to generate degraded cells. FIG. 4 illustrates an example where degraded cells DC are concentrated only in a portion, but this is just an example, and degraded cells DC may also be scattered. The degraded cells DC may generate an error during a reading operation thereby lowering a reliability of the memory device.

Figure 5:
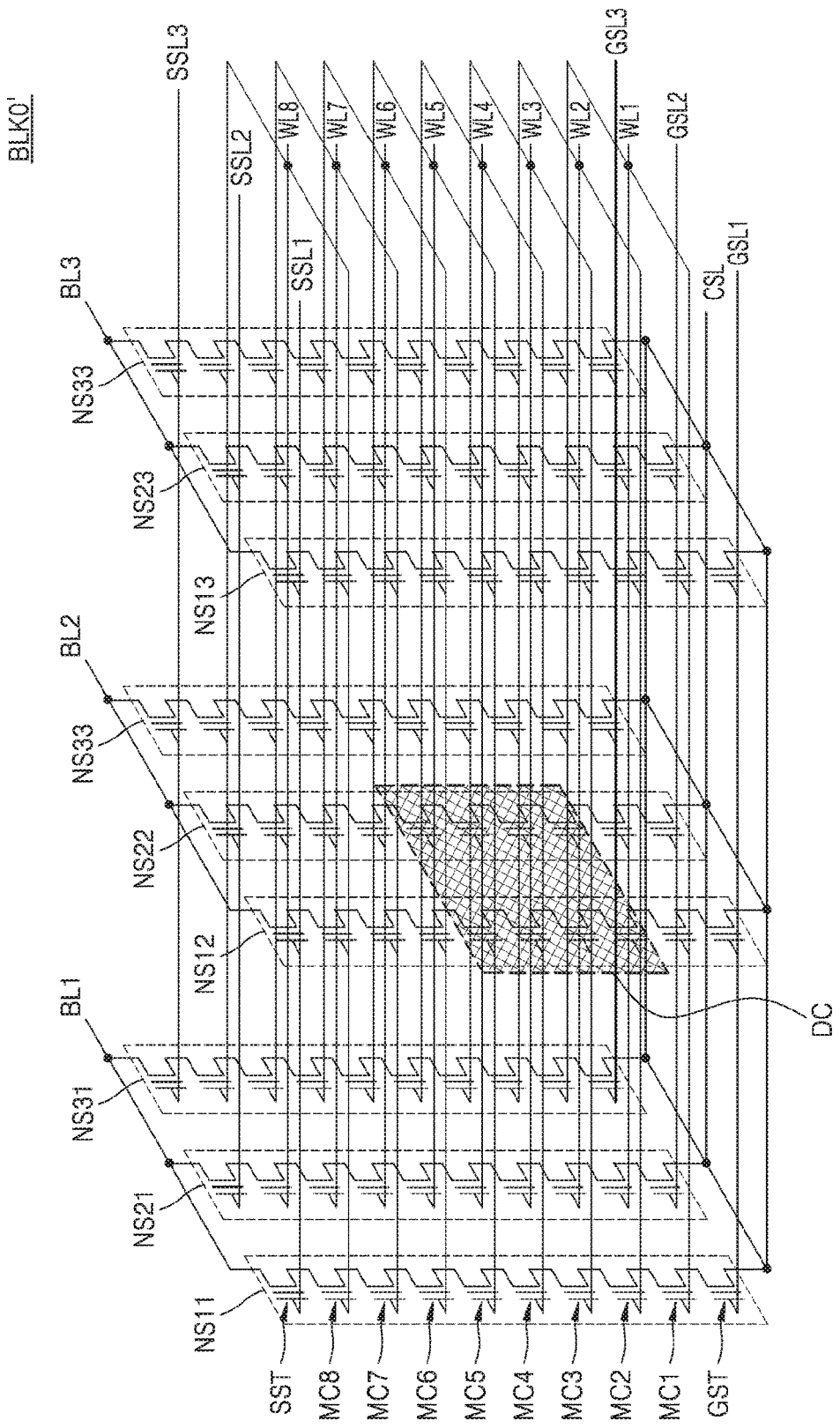
FIG. 5 is a circuit diagram illustrating another example of a memory block included in a memory cell array, according to at least some example embodiments of the inventive concepts.

FIG. 5 is a circuit diagram illustrating a memory block BLK0', which is another example of a memory block included in a memory cell array according to at least some example embodiments of the inventive concepts.

Referring to FIG. 5, the memory cell array (for example, the memory cell array 100 of FIG. 1) may be a memory cell array of a vertical NAND flash memory and include a plurality of memory blocks. Each memory block BLK0' may include a plurality of NAND strings NS11 through NS33, a plurality of word lines WL1 through WL8, a plurality of bit lines BL1 through BL3, a plurality of ground selection lines GSL1 through GSL3, a plurality of string selection lines SSL1 through SSL3, and a common source line CSL. The numbers of NAND strings, word lines, bit lines, ground selection lines, and string selection lines may be varied in various manners according to embodiments.

The NAND strings NS11, NS21, and NS31 are provided between a first bit line BL1 and a common source line CSL, and the NAND strings NS12, NS22, and NS32 are provided between a second bit line BL2 and the common source line CSL, and the NAND strings NS13, NS23, and NS33 are provided between a third bit line BL3 and the common source line CSL. Each NAND string (for example, the NAND string NS11) may include a string selection transistor SST, a plurality of memory cells MC1 through MC8, and a ground selection transistor GST that are serially connected to one another. Hereinafter, NAND strings will be referred to as strings for convenience.

Strings that are commonly connected to one bit line form one column. For example, For example, the NAND strings NS11, NS21, and NS31 connected to the first bit line BL1 may correspond to a first column. The NAND strings NS12, NS22, and NS32 connected to the second bit line BL2 may correspond to a second column. The NAND strings NS13, NS23, and NS33 connected to the third bit line BL3 may correspond to a third column.

The NAND strings connected to one string selection line may form one row. For example, the NAND strings NS11, NS12, and NS13 connected to a first string selection line SSL1 may form a first row. The NAND strings NS21, NS22, and NS23 connected to a second string selection line SSL2 may form a second row. The NAND strings NS31, NS32, and NS33 connected to a third string selection line SSL3 may form a third row.

Each string selection transistor SST is connected to one of corresponding string selection lines SSL1 through SSL3. The plurality of memory cells MC1 through MC8 are respectively connected to corresponding word lines WL1 through WL8. Each ground selection transistor GST is connected to one of corresponding ground selection lines GSL1 through GSL3. The string selection transistor SST is connected to corresponding bit lines BL1 through BL3, and the ground selection transistor GST is connected to the common source line CSL.

In the present embodiment, word lines at the same height (for example, the word lines WL1) may be connected to one another, and the string selection lines SSL1 through SSL3 may be separated from one another, and the ground selection lines GSL1 through GSL3 are also separated from one another. For example, when programming memory cells connected to the first word lines WL1 and belonging to the strings NS11, NS12, and NS13, the first word lines WL1 and the first string selection line SSL1 are selected. However, the embodiments are not limited thereto, and in another embodiment, the ground selection lines GSL1 through GSL3 may also be connected to one another.

Like the embodiment of FIG. 4, degraded cells DC may be generated in the memory cell array BLK0' of FIG. 5. FIG. 5 illustrates an example where degraded cells DC are concentrated only in a portion, but this is an example, and degraded cells DC may also be scattered. The degraded cells DC may generate an error during a reading operation to lower reliability of the memory device.

Figure 6:
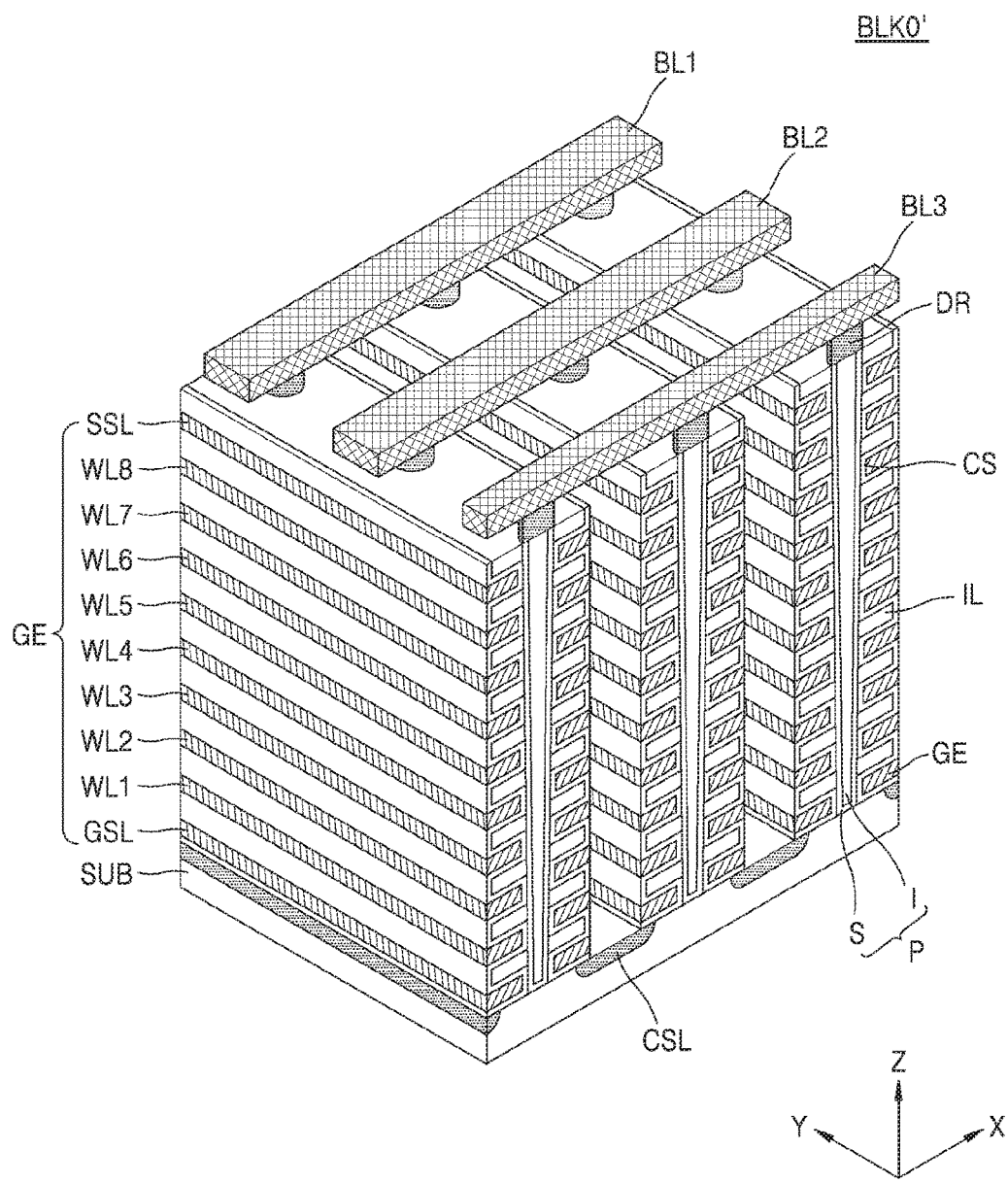
FIG. 6 is a perspective view of the memory block of FIG. 5.

FIG. 6 is a perspective view of the memory block BLK0' of FIG. 5.

Referring to FIG. 6, memory blocks included in the memory cell array (for example, the memory cell array 100 of FIG. 1) are arranged in a vertical direction with respect to a substrate SUB. In FIG. 6, the memory block BLK0' including two selection lines GSL and SSL, eight word lines WL1 through WL8, and three bit lines BL1 through BL3 is illustrated but may also include more or fewer selection lines, word lines, and bit lines.

The substrate SUB has a first conductivity type (for example, p-type), and common source lines CSL extending in a first direction (for example, a Y direction) and doped with impurities having a second conductivity type (for example, n-type) are provided on the substrate SUB. A plurality of insulation layers IL extending in the first direction are sequentially provided in a third direction (for example, a Z direction) on a region of the substrate SUB between two adjacent common source lines CSL, and the plurality of insulation layers IL are spaced apart from one another by a predetermined or, alternatively, desired distance along the third direction. For example, the plurality of insulation layers IL may include an insulation material such as a silicon oxide.

A plurality of pillars P that are sequentially arranged in the first direction and pass through the plurality of insulation layers IL in the third direction are provided on a region of the substrate SUB between two adjacent common source lines CSL. For example, the plurality of pillars P may pass through the plurality of insulation layers IL to contact the substrate SUB. In detail, a surface layer S of each pillar P may include a first-type silicon material and function as a channel region. An internal layer I of each pillar P may include an insulation material such as a silicon oxide or an air gap.

A charge storage layer CS is provided in a region between two adjacent common source lines CSL along exposed surfaces of the insulation layers IL, the pillars P, and the substrate SUB. The charge storage layer CS may include a gate insulation layer (or also referred to as a 'tunneling insulation layer'), a charge trap layer, and a blocking insulation layer. For example, the charge storage layer CS may have an oxide-nitride-oxide (ONO) structure. In addition, gate electrodes GE such as the selection lines GSL and SSL and the word lines WL1 through WL8 are provided on an exposed surface of the charge storage layer CS.

Drains or drain contacts DR are respectively provided on the plurality of pillars P. For example, the drains or the drain contacts DR may include a silicon material doped with second conductivity-type impurities. The bit lines BL1 through BL3 extending in a second direction (for example, a X direction) and spaced apart from one another by a predetermined or, alternatively, desired distance in the first direction are provided on the drains DR.

Figure 7A:
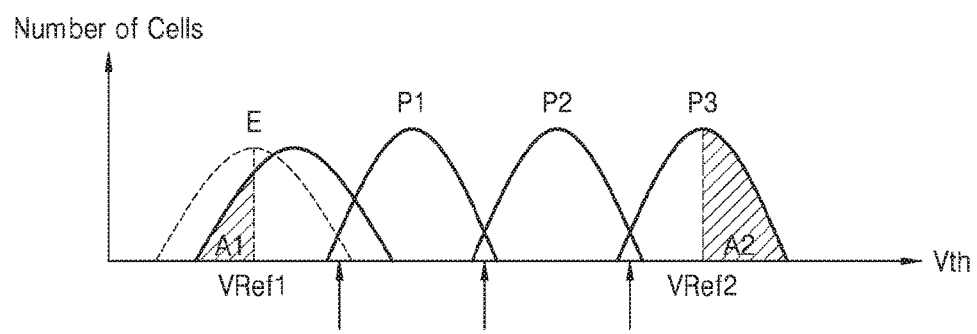
FIG. 7A is a graph showing when a threshold voltage distribution of an erase state is shifted due to disturb.

FIG. 7A is a graph showing when a threshold voltage distribution of an erase state is shifted due to disturb.

When a voltage is continuously applied to memory cells according to a write/read operation, that is, if a stress is continuously applied to memory cells, disturb (e.g., program disturb) may occur. When disturb occurs, a threshold voltage distribution of an erase state E may be shifted to a higher voltage. That is, a threshold voltage of memory cells in the erase state E may increase. However, disturb may not have a meaningful influence on a threshold voltage distribution of first through third program states P1, P2, and P3.

Referring to FIG. 7A, the threshold voltage distribution of the erase state E may be shifted to a higher voltage (moving from a dotted line to a solid line), and no or little change may be generated in a threshold voltage distribution of the third program state P3. Thus, a number A1 of memory cells below a first reference voltage VRef1 may be reduced from an initial distribution, whereas a number A2 of memory cells above a second reference voltage VRef2 may only slightly change.

Figure 7B:
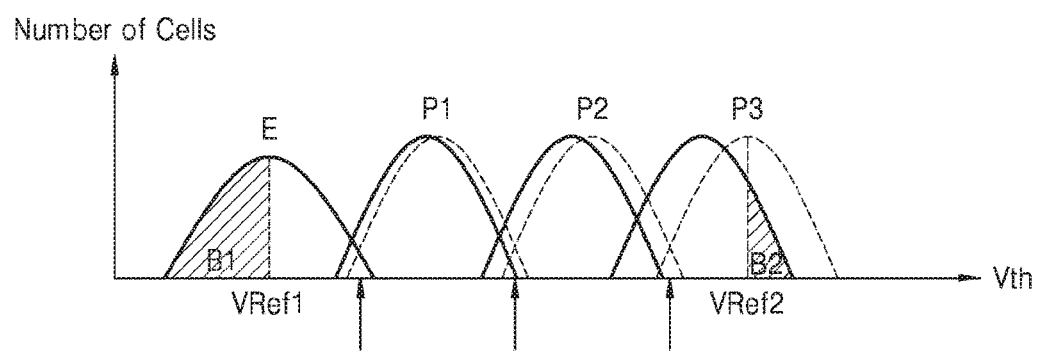
FIG. 7B is a graph showing when a threshold voltage distribution of a program state is shifted due to charge loss.

FIG. 7B is a graph showing when a threshold voltage distribution of a program state is shifted due to charge loss.

Charge loss refers to trapped charges escaping over time and causing a leakage current, and may be caused mainly due to retention characteristics. Retention refers to retaining stored values of a transistor storing information needed to enter an active mode even if a main power supply is blocked in order to reduce power consumption mode in a standby mode. For example, retention may refer to an ability of a non-volatile memory cell to maintain stored charges. When retention characteristics are degraded, charge loss may increase, and in this case, a threshold voltage distribution of the first through third program states P1, P2, and P3 may be shifted to a lower voltage. That is, threshold voltages of memory cells of the first through third program states P1, P2, and P3 may be reduced. However, charge loss may not have a meaningful influence on a threshold voltage distribution of the erase state E. When charge loss occurs, a variation in threshold voltage distribution of the third program state P3 may be greater than variations in threshold voltage distributions of the first and second program states P1 and P2.

Referring to FIG. 7B, the threshold voltage distribution of the third program state P3 may be moved to a lower voltage (moving from a dotted line to a solid line), and a variation in the threshold voltage of the erased state E may be relatively small. Accordingly, compared to an initial distribution, a number B1 of memory cells below a first reference voltage VRef1 may hardly change, but a number B2 of memory cells above a second reference voltage VRef2 may be reduced.

Figure 8A:
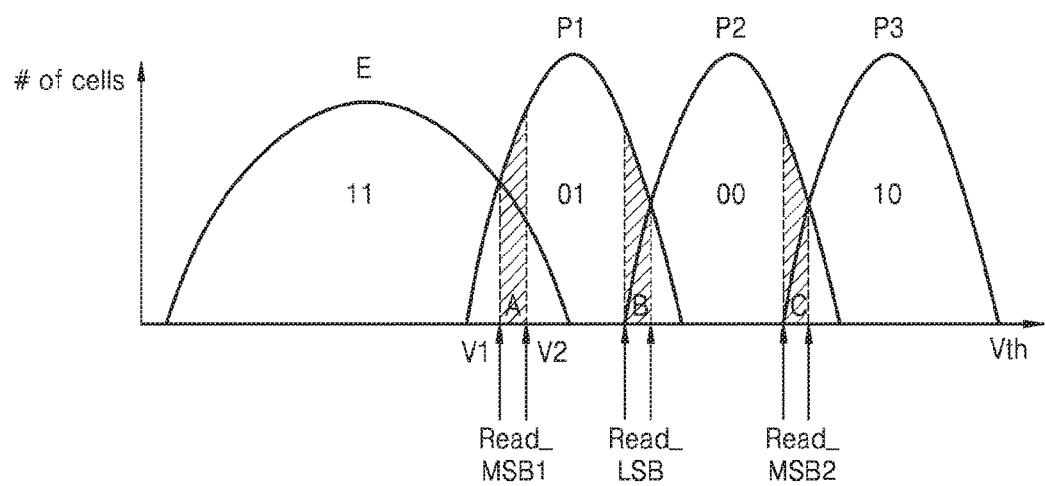
FIG. 8A is a graph showing an example of a voltage applied to a word line in a read operation to determine degradation, according to at least some example embodiments of the inventive concepts.

FIG. 8A is a graph showing an example of read levels in a read operation to determine degradation, according to at least some example embodiments of the inventive concepts.

Referring to FIG. 8A, a horizontal axis denotes a threshold voltage, and a vertical axis denotes the number of memory cells. For example, memory cells may be multi-level cells, and may have one of an erase state E, a first program state P1, a second program state P2, and a third program state P3 according to a threshold voltage Vth. When reading data of a multi-level cell, and if each memory cell stores two-bit data, a reading operation to determine three different states may be performed to determine data. For example, data of Least Significant Bit (LSB) may be determined through one reading operation for determining the states (for example, a LSB reading operation), and data of Most Significant Bit (MSB) may be determined through two reading operations for determining the states (for example, first and second MSB reading operations). Although not illustrated, if a memory cell stores data including three bits or more, the number of reading operations may be increased to determine more diverse states.

In addition, in each of the LSB reading operation and the first and second MSB reading operations, data corresponding to two read levels V1 and V2 may be read (or sensed). One of the two read levels V1 and V2 may be a voltage corresponding to a valley with respect to a threshold voltage distribution before degradation of a memory cell, and the other may correspond to a voltage that may be close to another valley shifted from the previous value due to degradation. A reading operation based on the two read levels V1 and V2 may be performed sequentially or simultaneously. Further, according to at least some example embodiments of the inventive concepts, in the threshold voltage distribution, a minimum error reading method for searching for a valley between two threshold voltage distributions may be performed (e.g., by the memory device 20) by reading data of the cells by means of a level changed to a negative or positive value from a reference voltage level and by counting a number of cells having the respective pieces of data (for example, by counting a number of cells having data of 0 and a number of cells having data of 1). When a plurality of areas are read through one read operation, a number of cells may be counted for each area, the minimum error read level for each area may be extracted by repeatedly performing the counting around the valley between the distributions.

Each of the two read levels V1 and V2 described above may correspond to a threshold voltage level which is a standard for determining data, and a read operation based on the two read levels V1 and V2 may be performed by changing a read voltage provided to memory cells. Alternatively, according to another embodiment, various types of factors may be used in regard to a data read operation. For example, by adjusting levels of various factors related to a read operation (for example, a reference voltage which is a standard for determining data, a reference current, a data sensing timing or the like), the read levels V1 and V2 which are data determination standards may be changed.

Meanwhile, in a first MSB read operation Read_MSB1, the counting circuit 200 may count the number of memory cells of a predetermined or, alternatively, desired distribution region (for example, a first distribution region A) based on a result of a read operation performed by using the two read levels V1 and V2. The number of memory cells of the first distribution region A may correspond to the number of memory cells that are degraded in the first MSB read operation Read_MSB1.

In addition, in the LSB read operation Read_LSB, the counting circuit 200 may count the number of memory cells of a predetermined or, alternatively, desired distribution region (for example, a second distribution region B) based on a result of a read operation performed by using the two read levels V1 and V2. The number of memory cells of the second distribution region B may correspond to the number of memory cells degraded in the LSB read operation Read_LSB.

In addition, in the second MSB read operation Read_MSB2, the counting circuit 200 may count the number of memory cells of a predetermined or, alternatively, desired distribution region (for example, a third distribution region C) based on a result of a read operation performed by using the two read levels V1 and V2. The number of memory cells of the third distribution region C may correspond to the number of memory cells degraded in the second MSB read operation Read_MSB2.

A data restoring operation may be performed under various conditions based on the counting results as above. In an operation of reading LSB data, a result of counting the number of memory cells of the second distribution region B may be compared with a predetermined or, alternatively, desired reference value, and a restoration algorithm may be performed based on a result of the comparison.

In addition, in an operation of reading MSB data, a result of counting the memory cells of the first distribution region A and a result of counting the number of memory cells of the third distribution region C may be used to perform a data restoring operation. For example, when both the number of memory cells of the first distribution region A and the number of memory cells of the third distribution region C exceed a predetermined or, alternatively, desired reference value, a restoration algorithm on MSB data may be performed. Alternatively, also when only one of the number of memory cells of the first distribution region A and the number of memory cells of the third distribution region C exceeds a predetermined or, alternatively, desired reference value, a restoration algorithm on MSB data may be performed.

Figure 8B:
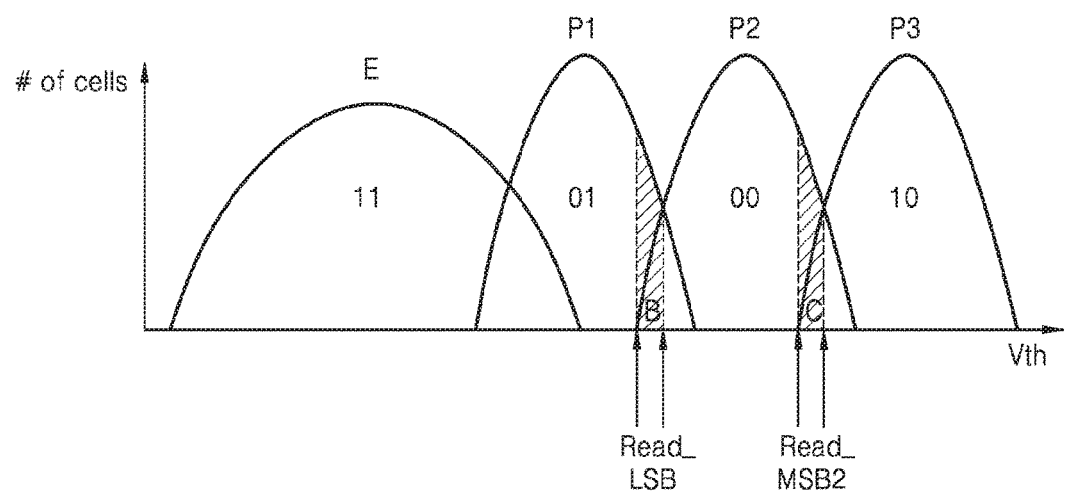
FIG. 8B is a graph showing another example of a voltage applied to a word line in a read operation to determine degradation, according to at least some example embodiments of the inventive concepts.

FIG. 8B is a graph showing another examples of read levels in a read operation for determining degradation, according to at least some example embodiments of the inventive concepts. Description of some details already described above with reference to FIG. 8A may be omitted in the following discussion of FIG. 8B.

Referring to FIG. 8B, a horizontal axis denotes a threshold voltage, and a vertical axis denotes the number of memory cells. For example, memory cells may be multi-level cells, and may have one of an erase state E, a first program state P1, a second program state P2, and a third program state P3 according to a threshold voltage Vth. To determine degradation, reading may be performed using two read levels in each of a LSB reading operation and an MSB reading operation. Unlike the embodiment of FIG. 8A, when a MSB read operation is performed twice, an operation of counting the number of memory cells of a predetermined or, alternatively, desired distribution region may be performed only with respect to one MSB read operation (for example, a second MSB read operation Read_MSB2). As described above, for example, if charge loss occurs, a threshold voltage distribution of a lower level may have a small variation, and thus, an operation of counting the number of degraded memory cells may be selectively performed only with respect to the second MSB read operation Read_MSB2 of an upper level.

Figure 9:
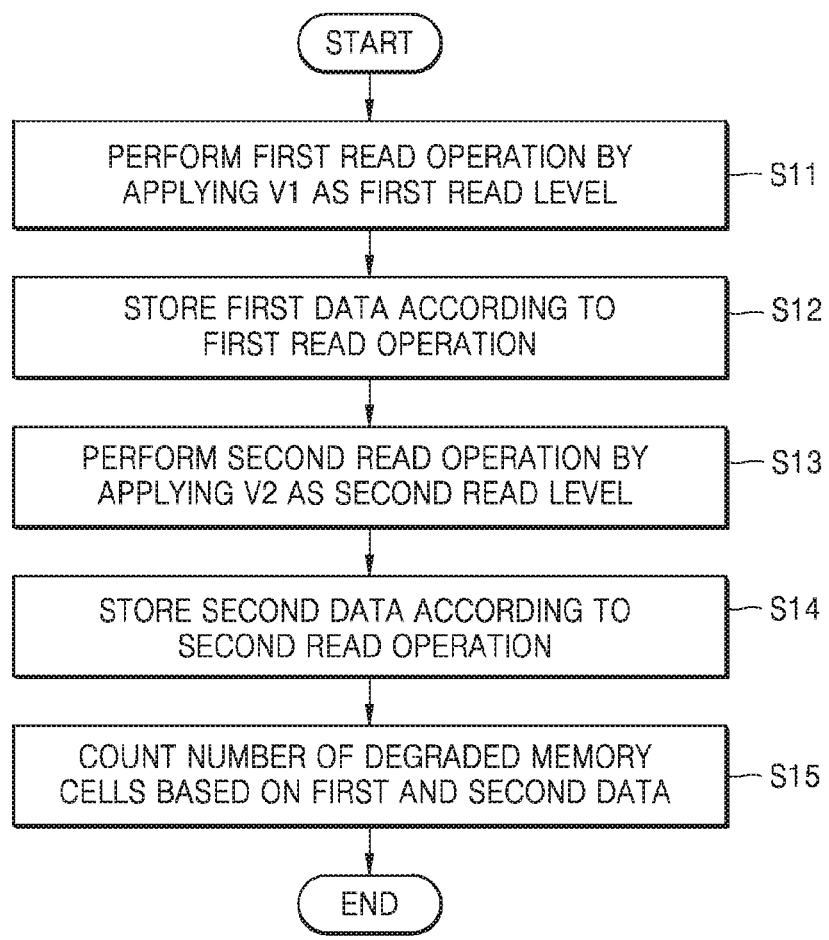
FIG. 9 is a flowchart of an operation of determining a degradation level of a memory cell, according to at least some example embodiments of the inventive concepts.

FIG. 9 is a flowchart of an operation of determining a degradation level of a memory cell according to at least some example embodiments of the inventive concepts.

Referring to FIGS. 1 and 9, in order to determine a degree of degradation of memory cells according to at least some example embodiments of the inventive concepts, a first read operation is performed on memory cells to be read, by using a first voltage as a first read level V1, in operation S11. According to the first read operation, first data determined based on the first read level V1 may be stored in a page buffer in operation S12.

In addition, a second read operation is performed on memory cells to be read, by using a second voltage as a second read level V2, in operation S13. According to the second read operation, second data determined based on the second read level V2 may be stored in a page buffer in operation S14. The second voltage V2 may be higher than the first voltage V1. By using the first data and the second data calculated as above, the number of degraded memory cells of a predetermined or, alternatively, desired distribution region may be counted in operation S15. The predetermined or, alternatively, desired distribution may correspond to the first through third distribution regions A, B, and C of FIGS. 8A and 8B.

Figure 10A:
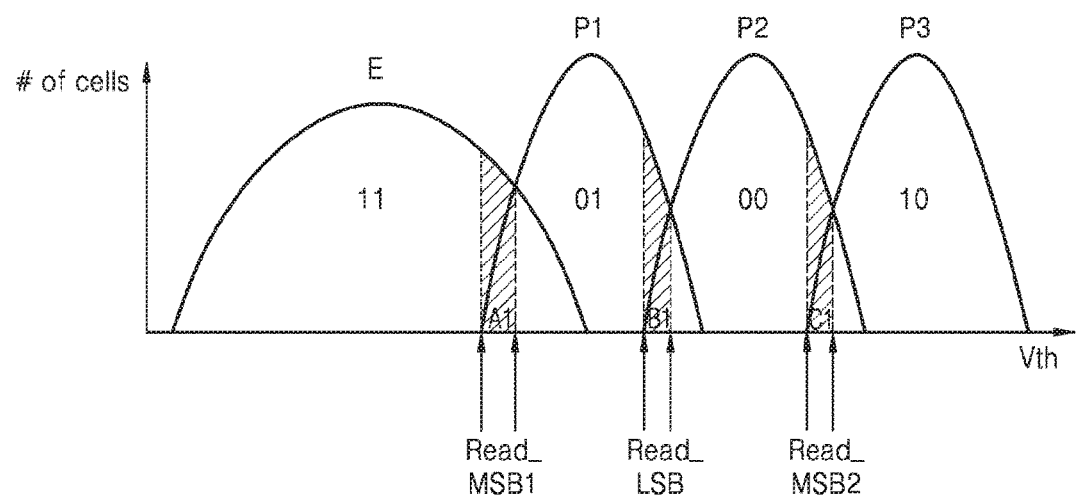
FIGS. 10A and 10B are graphs showing various examples of setting a distribution region to determine the number of degraded memory cells, according to at least some example embodiments of the inventive concepts.
Figure 10B:
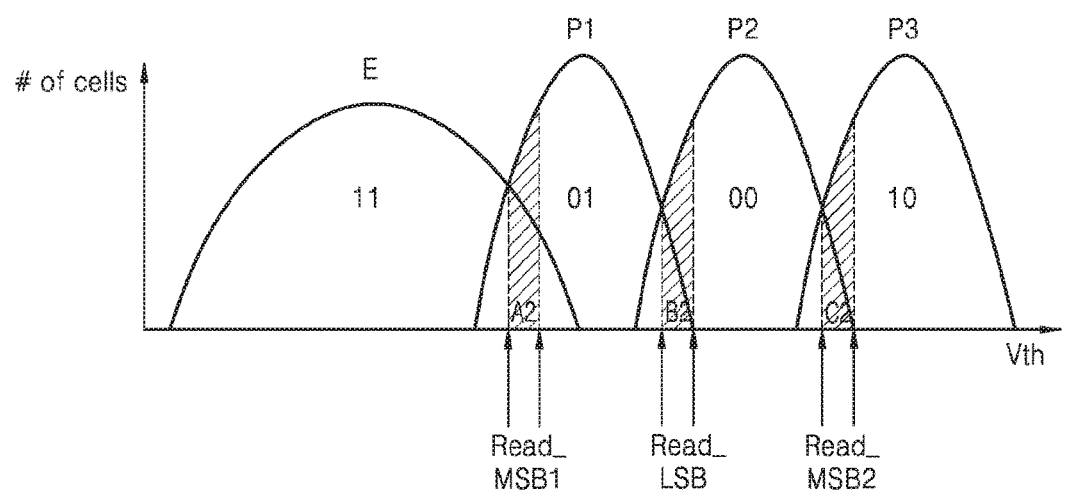

FIGS. 10A and 10B are graphs showing various examples of setting a distribution region to determine the number of degraded memory cells according to at least some example embodiments of the inventive concepts. Description of details described above with reference to FIGS. 8A and 8B will be omitted here.

Referring to FIGS. 10A and 10B, a horizontal axis may denote a threshold voltage, and a vertical axis may denote the number of memory cells. A region of a threshold voltage level of degraded cells DC may be set on the left or the right of a valley of a threshold voltage distribution.

In particular, in order to determine a degree of degradation due to charge loss, as in the embodiment of FIG. 10A, the number of memory cells of distribution regions A1, B1, and C1 between a level corresponding to a valley of a threshold voltage distribution and a level lower than the previous level by a predetermined or, alternatively, desired value may be counted. Counting results of the distribution regions A1, B1, and C1 may respectively correspond to the numbers of degraded cells DC of respective states.

In addition, in order to determine a degree of degradation due to disturb, as in the embodiment of FIG. 10B, the numbers of memory cells of distribution regions A2, B2, and C2 between a level corresponding to a valley of a threshold voltage distribution and a level higher than the previous level by a predetermined or, alternatively, desired value may be counted. Counting results of the distribution regions A2, B2, and C2 may correspond to the number of degraded cells DC of respective states.

Disturb and charge loss, which are respectively described with respect to the distribution regions of FIGS. 10A and 10B, are examples, and any factor that degrades memory cells may also be applied here. While the regions are illustrated to be either on the left side or the right side with respect to a valley, this is an example, and distribution regions may be differently set to determine a degree of degradation according to states. For example, in the LSB read operation Read_LSB and the second MSB read operation Read_MSB2, the number of degraded cells DC having a threshold voltage level on the left side with respect to a valley may be counted. In the first MSB read operation Read_MSB1, the number of degraded cells DC having a threshold voltage level on the right side with respect to the valley may be counted.

Figure 11:
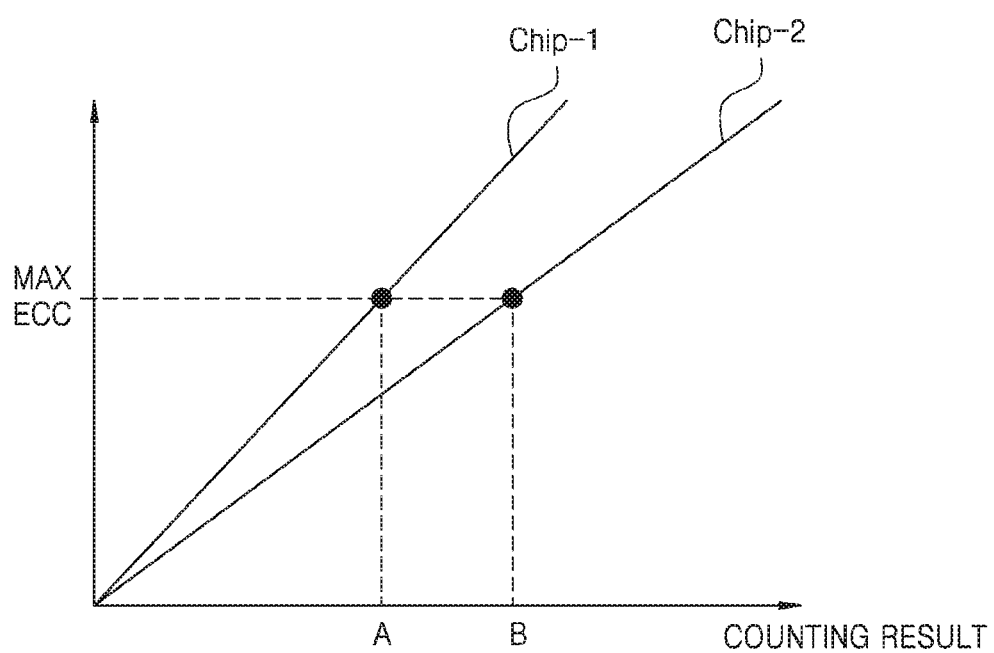
FIG. 11 is a graph showing characteristics or errors according to counting results from two memory devices (for example, first and second memory chips) having different characteristics.

FIG. 11 is a graph showing error characteristics according to counting results from two memory devices (for example, first and second memory chips) having different characteristics.

As in the above-described embodiments, the number of errors of data read in a normal read operation may be predicted based on the number of memory cells belonging to a predetermined or, alternatively, desired distribution region. For example, error characteristics based on counting results from two memory devices (for example, first and second memory chips chip-1 and chip-2) having different characteristics are illustrated in FIG. 11.

For example, as the number of degraded cells belonging to the above-described distribution region increases, the number of errors generated in read data may increase proportionally. Based on a correlation between the number of degraded cells and the number of errors, different reference values may be set to determine whether to perform a restoration algorithm for each memory device. For example, an error correcting code (ECC) circuit for correcting errors may be included in a memory controller, and a reference value may be set based on a maximum correction capacity MAX ECC of the memory controller.

When A degraded cells are counted from the above-described distribution region in a read operation of the first memory chip chip-1, the maximum correction capacity MAX ECC of the memory controller may be reached. In this case, in the first memory chip chip-1, the above-described counting result and a reference value corresponding to A may be compared with each other, and a restoration algorithm may be selectively performed based on a comparison result. On the other hand, in a read operation of the second memory chip chip-2, when B degraded cells, which are more than A degraded cells, are counted from the above-described distribution region, and the maximum correction capacity MAX ECC of the memory controller is reached, the above counting results and a reference value corresponding to B may be compared with each other in the second memory chip chip-2.

Figure 12:
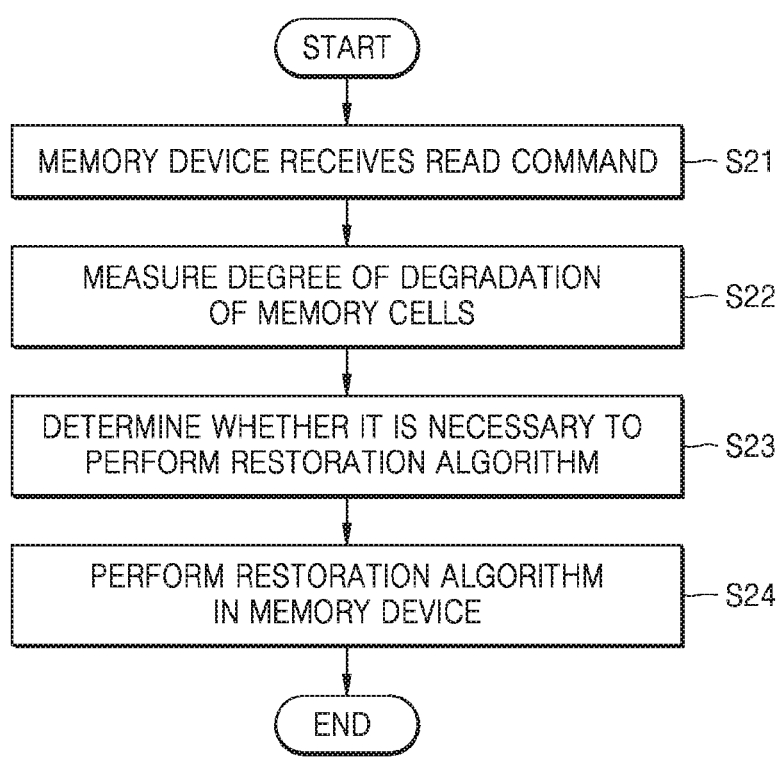
FIG. 12 is a flowchart of a data restoring method according to at least some example embodiments of the inventive concepts.

FIG. 12 is a flowchart of a data restoring method according to at least some example embodiments of the inventive concepts. The method will be described with reference to FIGS. 3 and 12.

In the data restoration method according to at least some example embodiments of the inventive concepts, when the memory device 20 receives a read command in operation S21, the counting circuit 200 measures a degree of degradation of memory cells by using data based on a combination of pieces of data that are read based on at least two read levels, and the control logic 300 may determine whether performance of a restoration algorithm is necessary or, alternatively, desired, based on a measurement result of the counting circuit 200 in operation S23. When the control logic 300 determines perform of a restoration algorithm to be necessary or, alternatively, desirable, the control logic 300 in the memory device 20 may perform a restoration algorithm to restore data in operation S24.

Figure 13A:
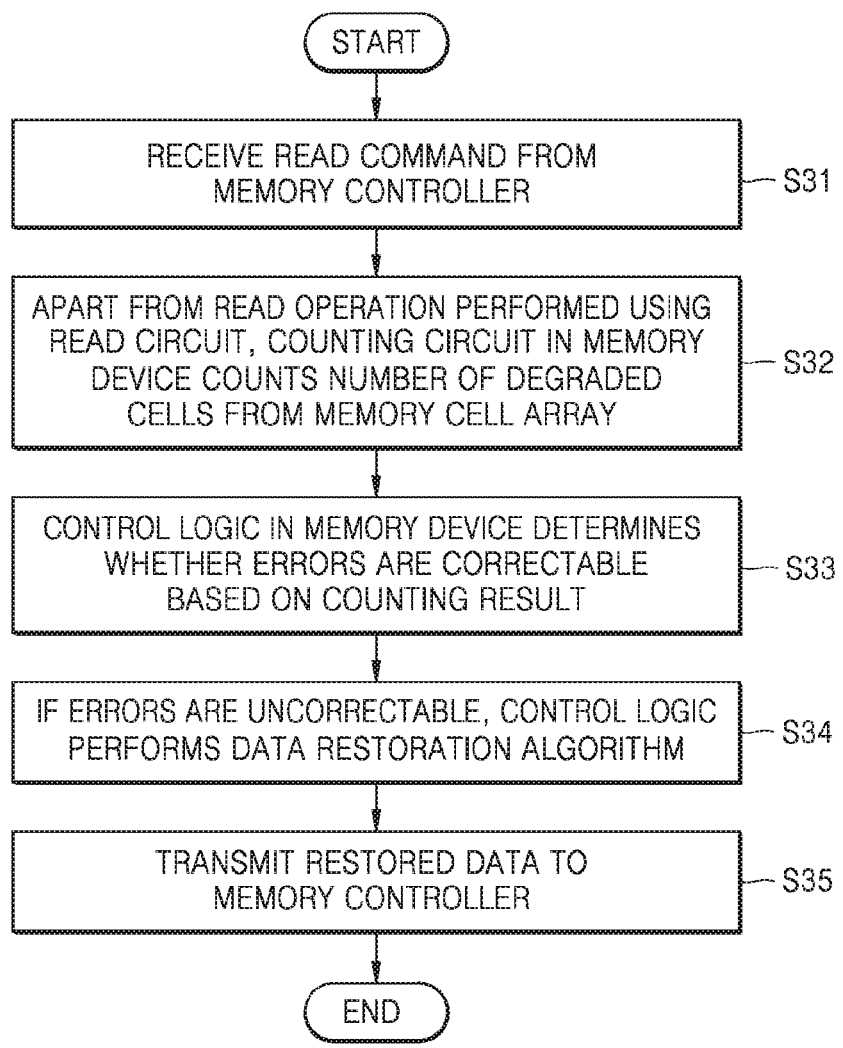
FIG. 13A is a flowchart of a data restoring method according to at least some example embodiments of the inventive concepts.

FIG. 13A is a flowchart of a data restoring method according to at least some example embodiments of the inventive concepts. The method will be described with reference to FIGS. 3 and 13A.

When the memory device 20 receives a read command from the memory controller 10 in operation S31, while a read operation is performed using a read circuit, the counting circuit 200 in the memory controller 20 may count the number of degraded cells DC from the memory cell array 100 in operation S32. The comparing unit 320 in the control logic 300 may determine whether errors are correctable based on a counting result CNT of the counting circuit 200 in operation S33. If errors are uncorrectable, the data restoring unit 310 of the control logic 300 may perform a data restoration algorithm in operation S34. When the restoration algorithm is completed by the data restoring unit 310, the memory device 20 may transmit restored data to the memory controller 10 in operation S35.

Figure 13B:
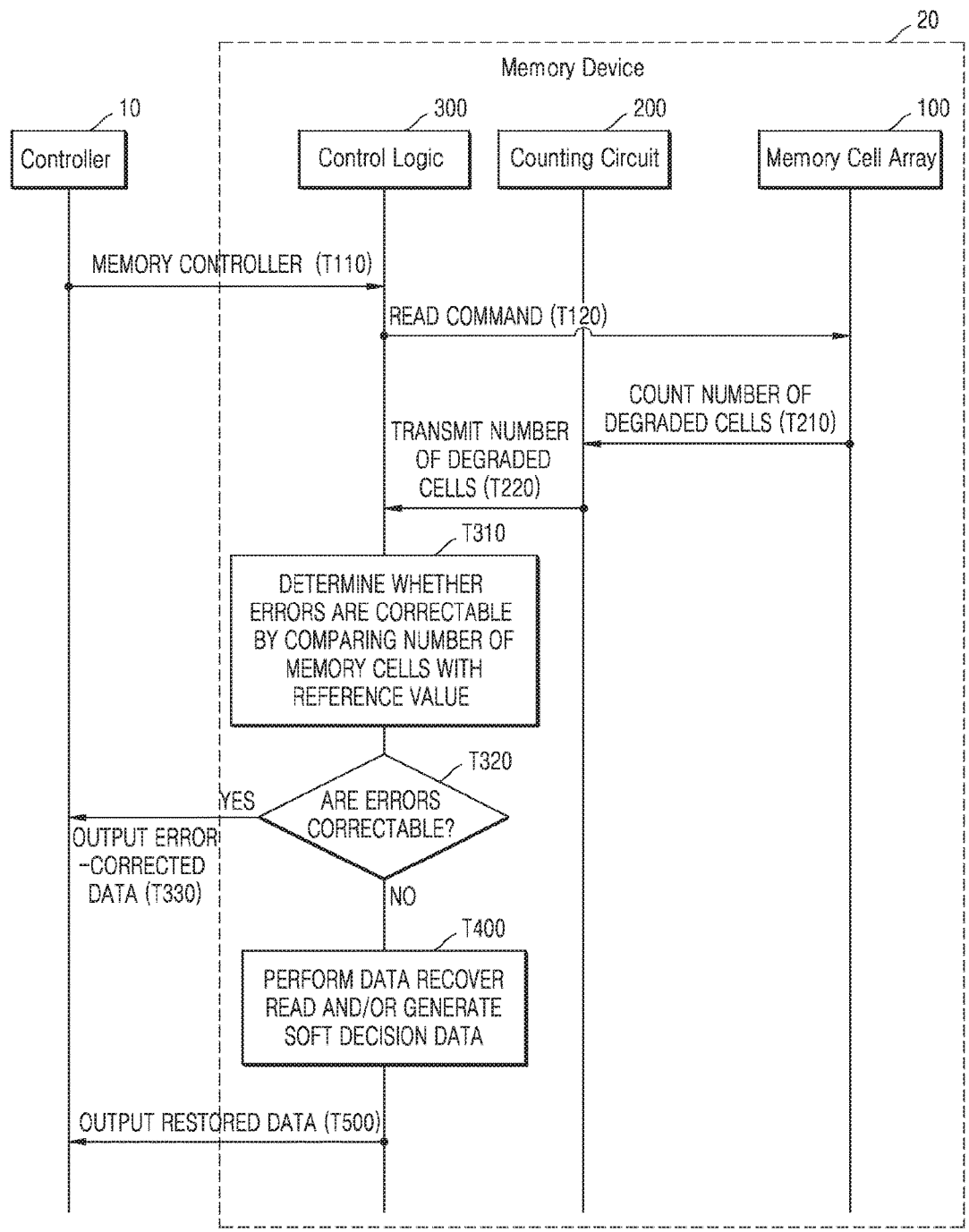
FIG. 13B illustrates operations of a data restoring method performed by elements of a memory system as time elapses, according to at least some example embodiments of the inventive concepts.

FIG. 13B illustrates operations of a data restoring method performed by elements of the memory system as time elapses, according to at least some example embodiments of the inventive concepts. The method will be described with reference to FIGS. 3 and 13B.

When a read command is transmitted from the memory controller 10 to the control logic 300 of the memory device 20 in operation T110, the control logic 300 may read data from the memory cell array 100 through a read circuit (not shown) in operation T120. According to the above-described embodiment, a read operation may be performed by using at least two read levels in a read operation to determine each state of memory cells, and the read data may be stored in a page buffer.

The counting circuit 200 may count the number of degraded cells DC by using the data from the page buffer (not shown) in operation T210. The counting circuit 200 may transmit a counting result CNT regarding the number of the degraded cells DC to the control logic 300 in operation T220. The comparing unit 320 of the control logic 300 may determine whether errors are correctable by comparing the counting result CNT received from the counting circuit 200, with a reference value in operation T310. When errors are correctable as a result of determination in operation T320, data having errors corrected by an error correction circuit (not shown) may be output to the memory controller 10 in operation T330. For example, the memory device 200 may include an ECC circuit that corrects correctable errors in read data. As another example, the control logic 300 may be capable of performing ECC decoding and/or encoding operations, and correcting correctable errors in read data. Alternatively, when the error correction circuit is included in the memory controller 10, the memory device 20 may transmit data having correctable errors to the memory device 10, and the memory controller 10 may perform error correction. If errors are uncorrectable in operation T320, the data restoring unit 310 of the control logic 300 may perform a data recover read operation and/or an operation of generating soft decision data by using a restoration algorithm. When data is restored using the restoration algorithm, the control logic 300 may transmit restored data to the memory controller 10 in operation T500.

Figure 14:
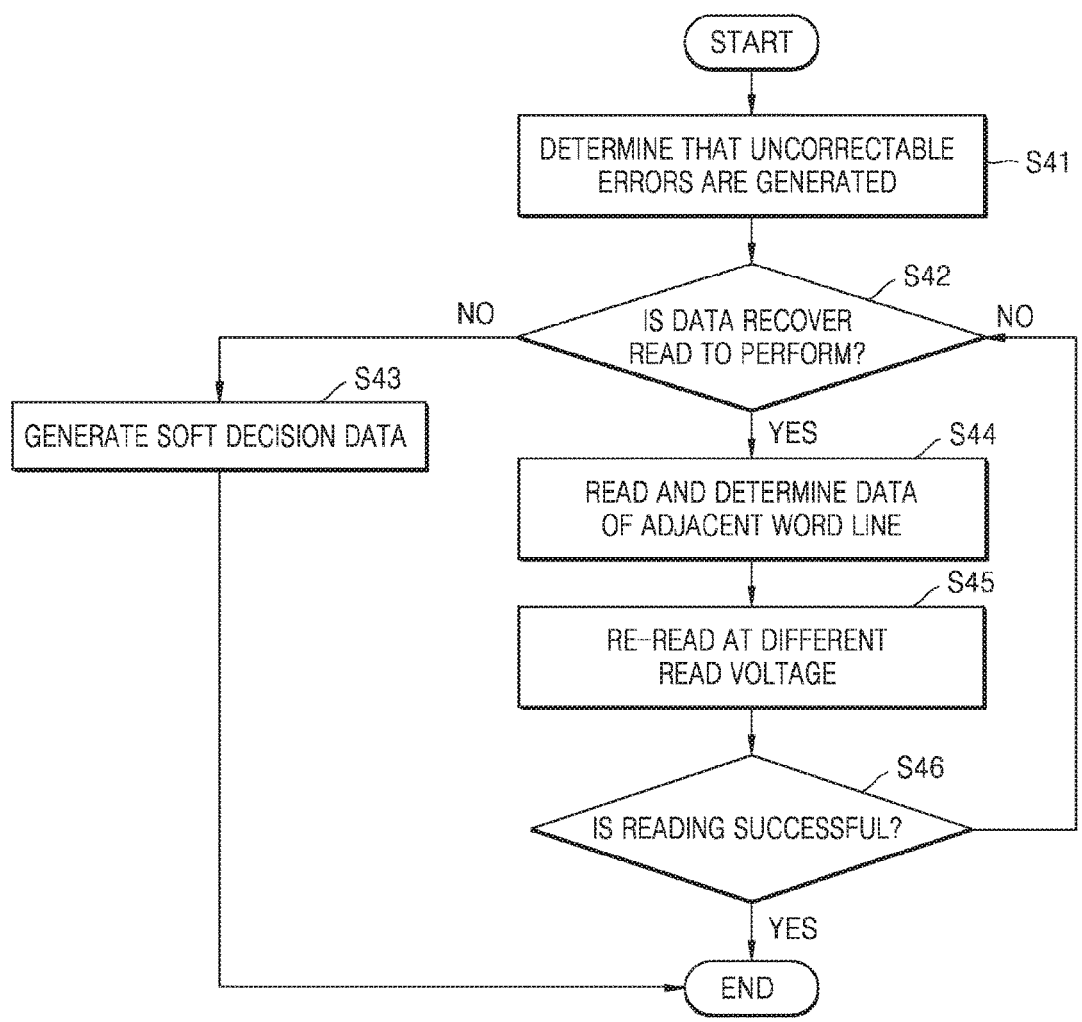
FIG. 14 is a flowchart of a data restoring method including a data recover read operation, according to at least some example embodiments of the inventive concepts.

FIG. 14 is a flowchart of a data restoring method including a data recover read operation, according to at least some example embodiments of the inventive concepts. The method will be described with reference to FIGS. 3 and 14.

Referring to FIG. 14, after a data read operation is performed, when information indicating that its errors are uncorrectable is transmitted to the data restoring unit 310 in operation S41, the data restoring unit 310 may determine whether to operate the data recover read unit 311 in operation S42. According to an embodiment, compared to the soft decision data generation unit 312, the data recover read unit 311 may be operated when an error is less serious.

When operating the data recover read unit 311, the control logic 300 may re-read data at a different read voltage in operation S45. For example, information related to a level of a read voltage used when performing a re-read operation may be previously stored in the memory device 20, and the level of the read voltage in a re-read operation may be changed by referring to the information.

According to another embodiment, when performing a data recover read operation, data of a word line adjacent to a region from which original data is read (for example, a page) may be read, and the read data may be determined in operation S44. If a region of the adjacent word line corresponds to an already programmed state based on a result of determining the adjacent word line, an operation of changing a level of the above-described read voltage may be performed based on the result. That is, that fact that the region of the adjacent word line is programmed may indicate that the region from which original data is read is disturbed, and thus, the operation of changing the level of the read voltage described above may be based on a result of determining data of the region of the adjacent word line.

According to the re-read operation, when the error is corrected and a normal read operation is successfully performed on data in operation S46, the control logic 300 may transmit re-read data to the memory controller 10. On the other hand, when a normal read operation fails, the memory device 20 may determine whether to operate the data recover read unit 311 again in operation S42. When the data recover read unit 311 is operated, re-reading may be performed by changing a read voltage again in operation S45. On the other hand, depending on the degree or an error generated in data, an operation of generating soft decision data may be performed instead of the data recover read unit 311. For example, if an error degree is serious, an operation of generating soft decision data may be performed in operation S43.

Figure 15:
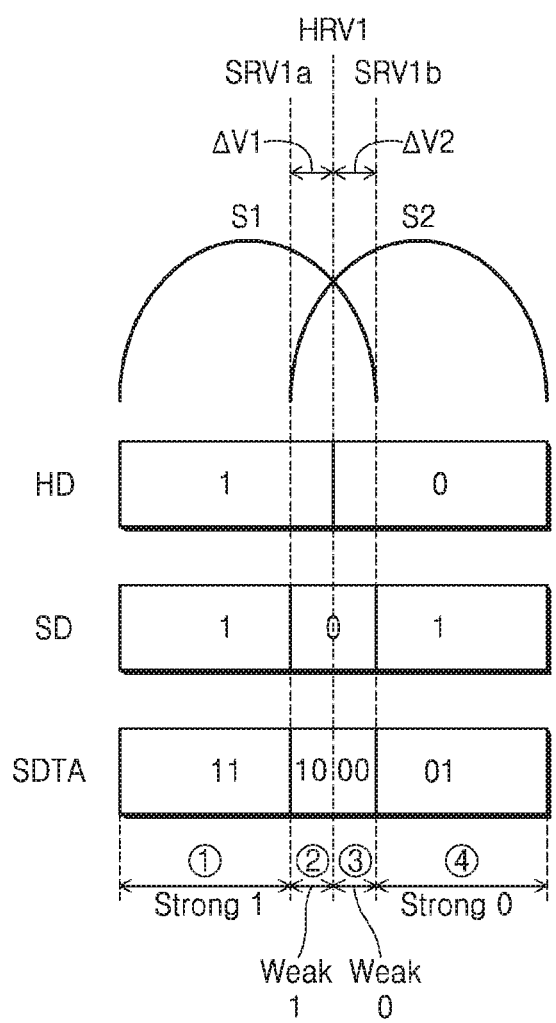
FIG. 15 is a flowchart of a data restoring method including an operation of generating soft decision data, according to at least some example embodiments of the inventive concepts.

FIG. 15 is a flowchart of a data restoring method including an operation of generating soft decision data, according to at least some example embodiments of the inventive concepts.

First, a first hard read voltage HRV1 may be applied to a first address of a first region (or a page) to determine whether a threshold voltage of each memory cell of the first region belongs to a first threshold voltage state S1 or a second threshold voltage state S2. Memory cells having a lower threshold voltage than the first hard read voltage HRV1 may be identified as 1 (i.e., storing data value "1"), and memory cells having a higher threshold voltage than the first hard read voltage HRV1 may be identified as 0 (i.e., storing data value "0").

The first hard read voltage HRV1 may have a voltage level identical to a normal read voltage used to determine the first threshold voltage state S1 and the second threshold voltage state S2 in a normal read operation. In a MLC flash memory having four or more different threshold voltage states, a normal read voltage may have multiple voltage levels, and in this case, the first hard read voltage HRV1 may have a voltage level used to identify the first threshold voltage state S1 and the second threshold voltage state S2 among the multiple voltage levels. Data identified using the first hard read voltage HRV1 may be referred to as hard data HD.

Next, a first soft read voltage SRV1a and a second soft read voltage SRV1b, which are in a pair and respectively have a first voltage variation ΔV1 and a second voltage variation ΔV2 with respect to the first hard read voltage HRV1, may be sequentially applied to the first address to generate soft data SD. For example, the soft data SD may be generated using data read using the first soft read voltage SRV1a and data read using the second read voltage SRV1b.

Meanwhile, soft decision data SDTA may be generated based on hard data HD and soft data SD. According to the example of FIG. 15, soft decision data SDTA, which is based on hard data HD and soft data SD, may have values of 11, 10, 00, and 01 with respect to sections ①, ②, ③ and ④, respectively. However, At least some example embodiments of the inventive concepts are not limited thereto, and soft decision data SDTA based on hard data HD and soft data SD may also have other different values.

The memory device 20 may provide both the hard data HD and the soft decision data SDTA to the memory controller. The memory controller may process data (bits)

corresponding to section ①, in which soft decision data SDTA among the hard data HD is identified as 11, as strong 1 (indicating that a data value (bits) is identified as 1 and is highly likely to be 1). In addition, data (bits) corresponding to section ②, in which soft decision data SDTA among the hard data HD is identified as 10, may be processed as weak 1 (indicating that a data value (bits) is identified as 1 but is less likely to be 1). Likewise, data (bits) corresponding to section ③, in which soft decision data SDTA among the hard data HD is identified as 00, may be processed as weak 0 (indicating a data value (bits) is identified as 0 but is less likely to be 0). Data (bits) corresponding to section ④, in which soft decision data SDTA among the hard data HD is identified as 01, may be processed as strong 0 (indicating that a data value (bits) is identified as 0 but is highly likely to be 0).

Data of the hard data HD may be weighted according to the above-described soft decision data SDTA, and weights obtained as a result of soft decision may be a standard for error correction which will be described later. Thus, accurate error correction may be performed according to accurate soft decision data SDTA, that is, according to weights assigned based on a result of identifying threshold voltages of respective memory cells through a soft decision operation.

Meanwhile, referring to FIGS. 8A and 15, in order to count degraded cells DC that are degraded during a read operation, read operations may be performed by using the first read level V1 and the second read level V2 may be already performed as described above, and data obtained through two read operations may be stored in a memory device (for example, a page buffer). According to an embodiment, a read result according to the first read level V1 may correspond to a read result according to the hard read voltage HRV1. Also, a read result according to the second read level V2 may correspond to a read result according to a first soft read voltage SRV1a. Accordingly, in an operation of generating soft decision data according to at least some example embodiments of the inventive concepts, soft decision data SDTA may be generated by further performing a read operation that uses only a second soft read voltage SRV1b.

Figure 16:
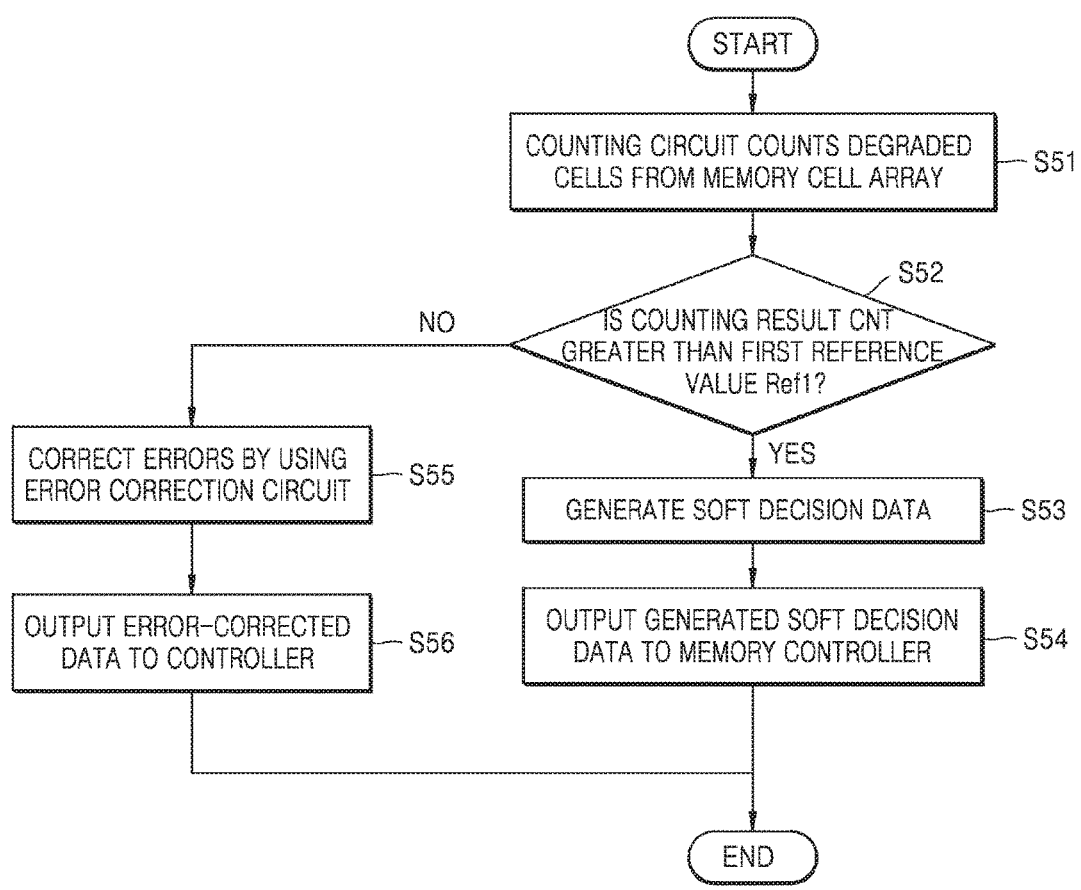
FIG. 16 is a flowchart of a data restoring method according to at least some example embodiments of the inventive concepts.

FIG. 16 is a flowchart of a data restoring method according to at least some example embodiments of the inventive concepts. The method will be described with reference to FIGS. 3 and 16.

Referring to FIG. 16, when the counting circuit 200 counts degraded cells DC from the memory cell array 100 in operation S51 and outputs a counting result CNT to the comparing unit 320 as described above, the comparing unit 320 may compare the counting result CNT with a first reference value Ref1 to determine whether the counting result CNT is greater than the first reference value Ref1 in operation S52. The first reference value Ref1 may be a preset or, alternatively, desired value to determine whether to generate soft decision data in the error soft decision data generation unit 312. When the counting result CNT is greater than the first reference value Ref1, the data restoring unit 310 of the control logic 300 in the memory device 20 may control an operation of generating soft decision data in the soft decision data generation unit 312 in operation S53. When the soft decision data is generated, the control logic 300 may output the soft decision data to the memory controller 10 in operation S54. On the other hand, when the counting result CNT is smaller than the first reference value Ref1 in operation S52, error correction is performed using an error correction circuit (not shown) included in the memory device 20 or the memory controller 10 to correct errors in data in operation S55. When the memory device 20 includes an error correction circuit, data having an error corrected using the error correction circuit may be output to the memory controller 10 in operation S56.

Figure 17:
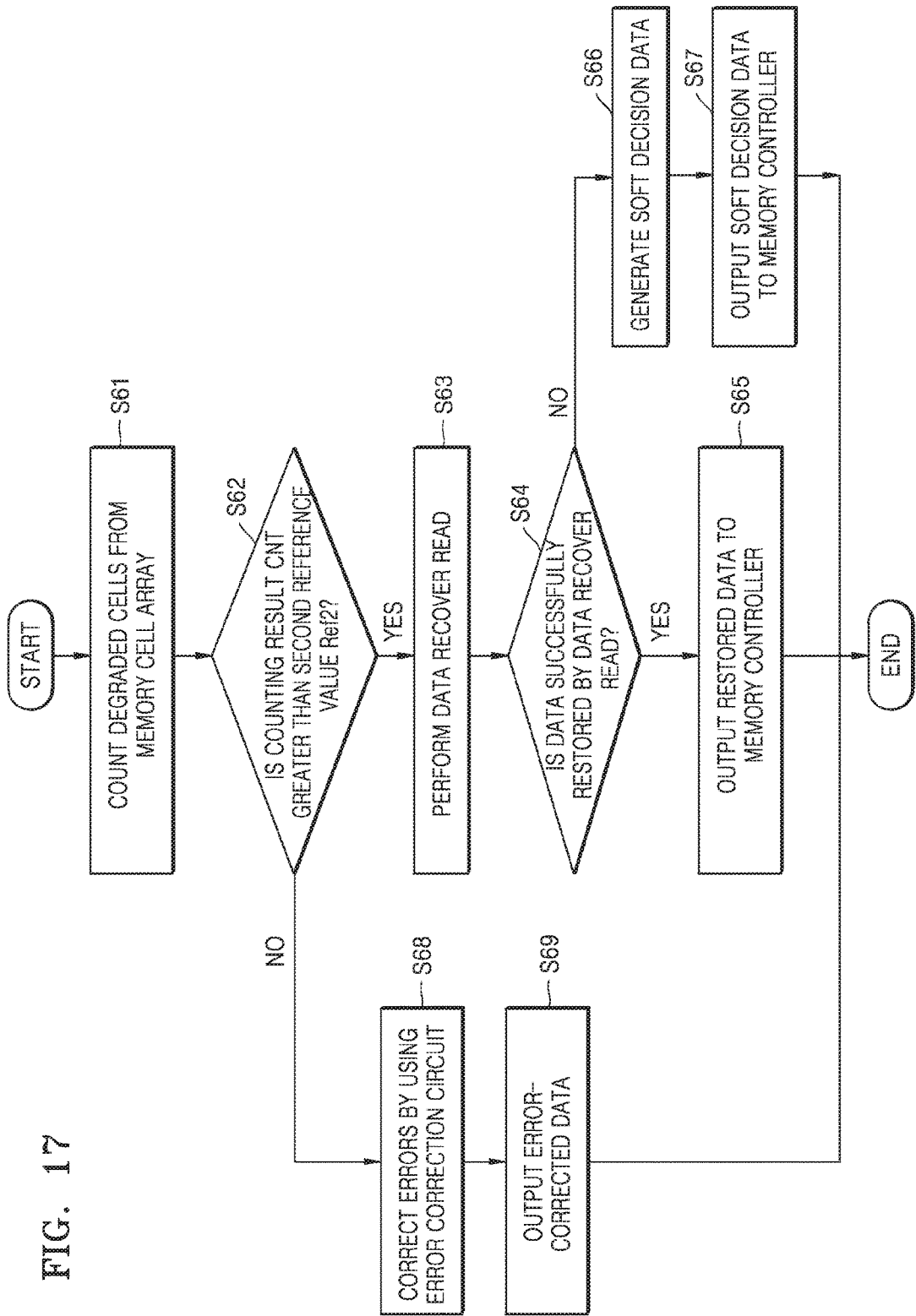
FIG. 17 is a flowchart of a data restoring method according to at least some example embodiments of the inventive concepts.

FIG. 17 is a flowchart of a data restoring method according to at least some example embodiments of the inventive concepts. The method will be described with reference to FIGS. 3 and 17.

Referring to FIG. 17, when the counting circuit 200 counts degraded cells DC from the memory cell array 100 in operation S61 and outputs a counting result CNT to the comparing unit 320 as described above, the comparing unit 320 may compare the counting result CNT with a second reference value Ref2 to determine whether the counting result CNT is greater than the second reference value Ref2 in operation S62. The second reference value Ref2 may be a preset or, alternatively, desired count to be used to perform a data recover read operation and/or generate soft decision data by determining whether data has an uncorrectable error. When the counting result CNT is greater than the second reference value Ref2, the data restoring unit 310 of the control logic 300 in the memory device 20 may perform a data recover read operation in operation S63. When data restoration is successfully performed through the data recover read operation in operation S64, the control logic 300 may output restored data to the memory controller 10 in operation S65. When data restoration through the data recover read operation is unsuccessful in operation S64, the data restoring unit 310 of the control logic 300 in the memory device 20 may generate soft decision data in operation S66. When the soft decision data is generated, the control logic 300 may output the soft decision data to the memory controller 10 in operation S67. According to an embodiment, the control logic 300 may output the soft decision data together with normal data. When the counting result CNT is smaller than the second reference value Ref2 in operation S62, error correction may be performed using an error correction circuit (not shown) included in the memory device 20 or the memory controller 10 in operation S68. When the memory device 20 includes an error correction circuit, data having an error corrected using the error correction circuit may be output to the memory controller 10 in operation S69.

Figure 18:
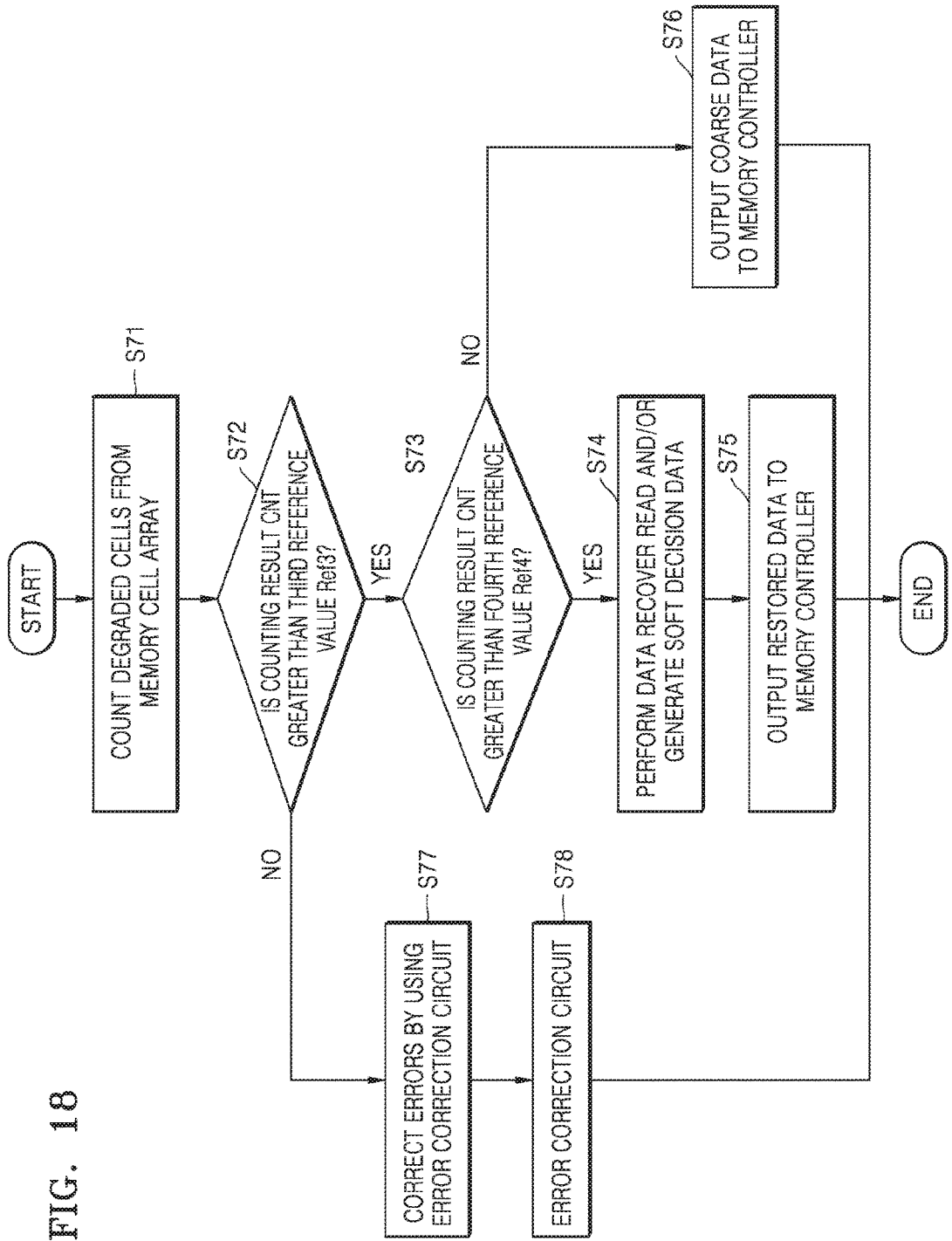
FIG. 18 is a flowchart of a data restoring method according to at least some example embodiments of the inventive concepts.

FIG. 18 is a flowchart of a data restoring method according to at least some example embodiments of the inventive concepts. The method will be described with reference to FIGS. 3 and 18.

Referring to FIG. 18, when the counting circuit 200 counts degraded cells DC from the memory cell array 100 in operation S71 and outputs a counting result CNT to the comparing unit 320 as described above, the comparing unit 320 may compare the counting result CNT with a third reference value Ref3 to determine whether the counting result CNT is greater the third reference value Ref3 in operation S72. The third reference value Ref3 may be a preset or, alternatively, desired count to be used to determine data having an uncorrectable error. When the counting result CNT is greater than the third reference value Ref3, the comparing unit 320 may compare the counting result CNT with a fourth reference value Ref4 to determine once again whether the counting result CNT is greater than the fourth reference value Ref4 in operation S73. The fourth reference value Ref4 may be a preset or, alternatively, desired count to be used to determine whether an error is so serious that restoration through a restoration algorithm is required in the case when an uncorrectable error occurs.

When the counting result CNT is greater than the fourth reference value Ref4, the data restoring unit 310 of the control logic 300 in the memory device 20 may perform a data recover read operation and/or generate soft decision data in operation S74. As described above, the data recover read operation 311 and/or generation of soft decision data 312 may be performed individually or sequentially. When data is successfully restored through the data recover read operation 311 and/or generation of soft decision data 312, the control logic 300 may output restored data to the memory controller 10 in operation S75. The restored data may correspond to an operation of outputting read data through the data recover read operation 311 or an operation of outputting both hard data (normal data) and soft decision data together when performing the operation of generating soft decision data 312.

When the counting result CNT is smaller than the fourth reference value Ref4 in operation S73, the memory device 20 may output coarse data to the memory controller 10 in operation S76. According to an embodiment, data read by using the above-described first and second read levels V1 and V2 may be stored in a page buffer, and data read by using one of the read levels may be provided to the memory controller 10 as coarse data. For example, when referring to the second MSB read operation Read_MSB2 of FIG. 8B, data read by using the first read level V1, which is lower than a voltage corresponding to the valley, may be provided to the memory controller 10 as coarse data. The memory device 20 may output the coarse data as final data requested by the memory controller 10.

The fact that the counting result CNT is greater than the third reference value Ref3 and smaller than the fourth reference value Ref4 may indicate that a variation amount of a threshold voltage distribution is relatively small even when an uncorrectable error is generated. In this case, the first read level V1 may be closer to a valley of a threshold voltage distribution after degradation, and accordingly, data read by using the first read level V1 may have fewer errors than when the second read level V2 is used. Accordingly, data read using the first read level V1 (for example, coarse data) may be provided to the memory controller 10.

Meanwhile, when the counting result CNT is less than the third reference value Ref3 in operation S72, error correction may be performed using an error correction circuit (not shown) that may be included in the memory device 20 or the memory controller 10 in operation S77. When the memory device 20 includes an error correction circuit, data having an error corrected using the error correction circuit may be output to the memory controller 10 in operation S78.

Figure 19:
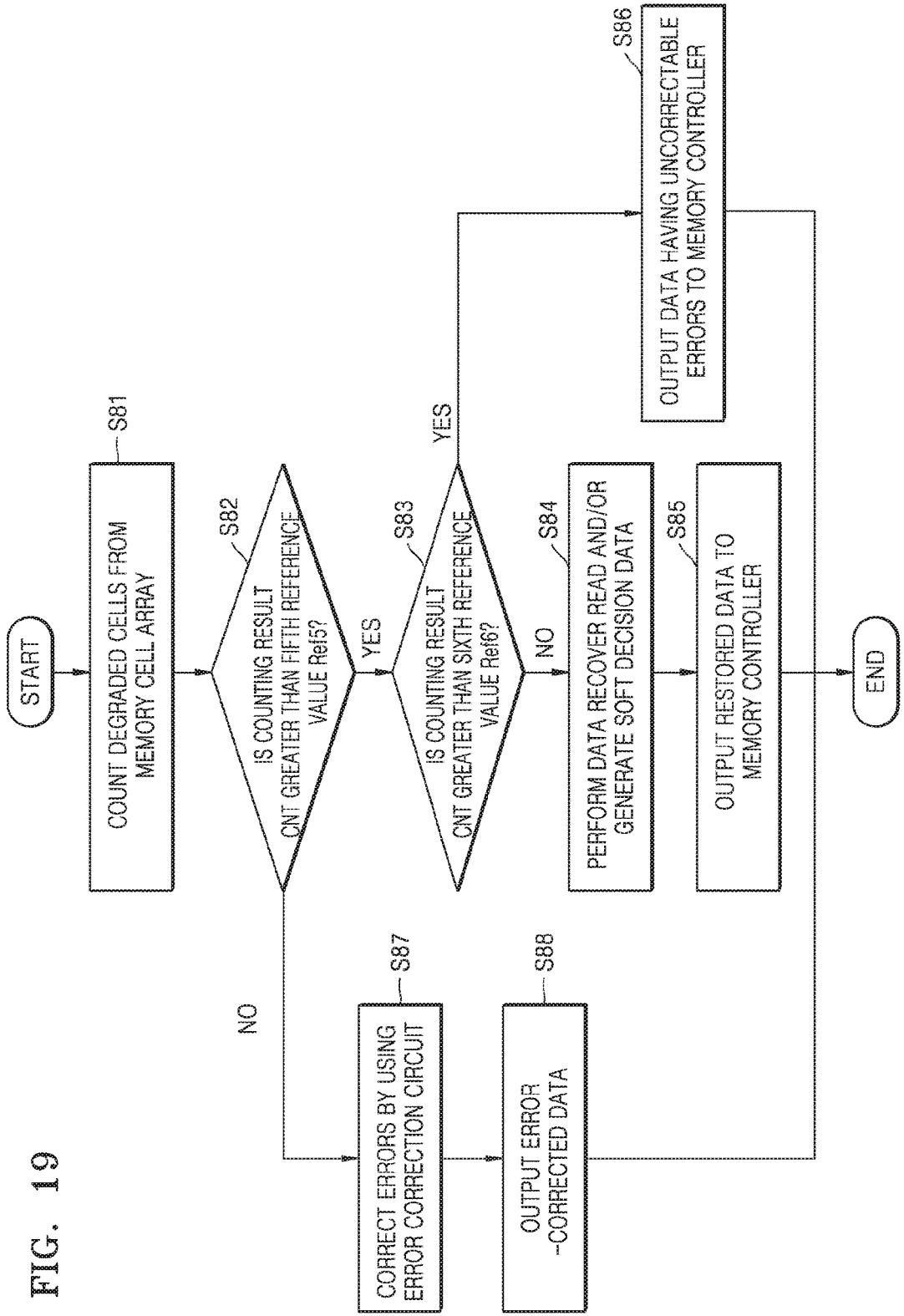
FIG. 19 is a flowchart of a data restoring method according to at least some example embodiments of the inventive concepts.

FIG. 19 is a flowchart of a data restoring method according to at least some example embodiments of the inventive concepts. The method will be described with reference to FIGS. 3 and 19.

Referring to FIG. 19, when the counting circuit 200 counts degraded cells DC from the memory cell array 100 in operation S81 and outputs a counting result CNT to the comparing unit 320 as described above, the comparing unit 320 may compare the counting result CNT with a fifth reference value Ref5 to determine whether the counting result CNT is greater the fifth reference value Ref5 in operation S82. The fifth reference value Ref5 may be a preset or, alternatively, desired count to be used to determine data having an uncorrectable error. When the counting result CNT is greater than the fifth reference value Ref5, the comparing unit 320 may compare the counting result CNT with a sixth reference value Ref6 to determine once again whether the counting result CNT is greater than the sixth reference value Ref6 in operation S83. The sixth reference value Ref6 may be a preset count or, alternatively, desired to be used to determine whether errors are correctable by the control logic 300 by using a restoration algorithm.

When the counting result CNT is greater than the sixth reference value Ref6, the errors may be so serious that they may be uncorrectable by the data restoring unit 310 of the control logic 300 in the memory device 20. In this case, the control logic 300 may output data having an uncorrectable error to the memory controller 10 in operation S86, and the memory controller 10 may perform error correction.

When the counting result CNT is smaller than the sixth reference value Ref6, the data restoring unit 310 of the control logic 300 in the memory device 20 may perform a data recover read operation and/or generate soft decision data in operation S84. As described above, the data recover read operation 311 and/or generation of soft decision data may be performed individually or sequentially. When data is successfully restored through the data recover read operation and/or generation of soft decision data, the control logic 300 may output restored data to the memory controller 10 in operation S85. The restored data may correspond to an operation of outputting read data through the data recover read operation or an operation of outputting both hard data (normal data) and soft decision data together when performing an operation of generating the soft decision data.

When the counting result CNT is smaller than the fifth reference value Ref5 in operation S82, error correction may be performed using an error correction circuit in operation S87. When the memory device 20 includes an error correction circuit, data having an error corrected using the error correction circuit may be output to the memory controller 10 in operation S88.

Figure 20:
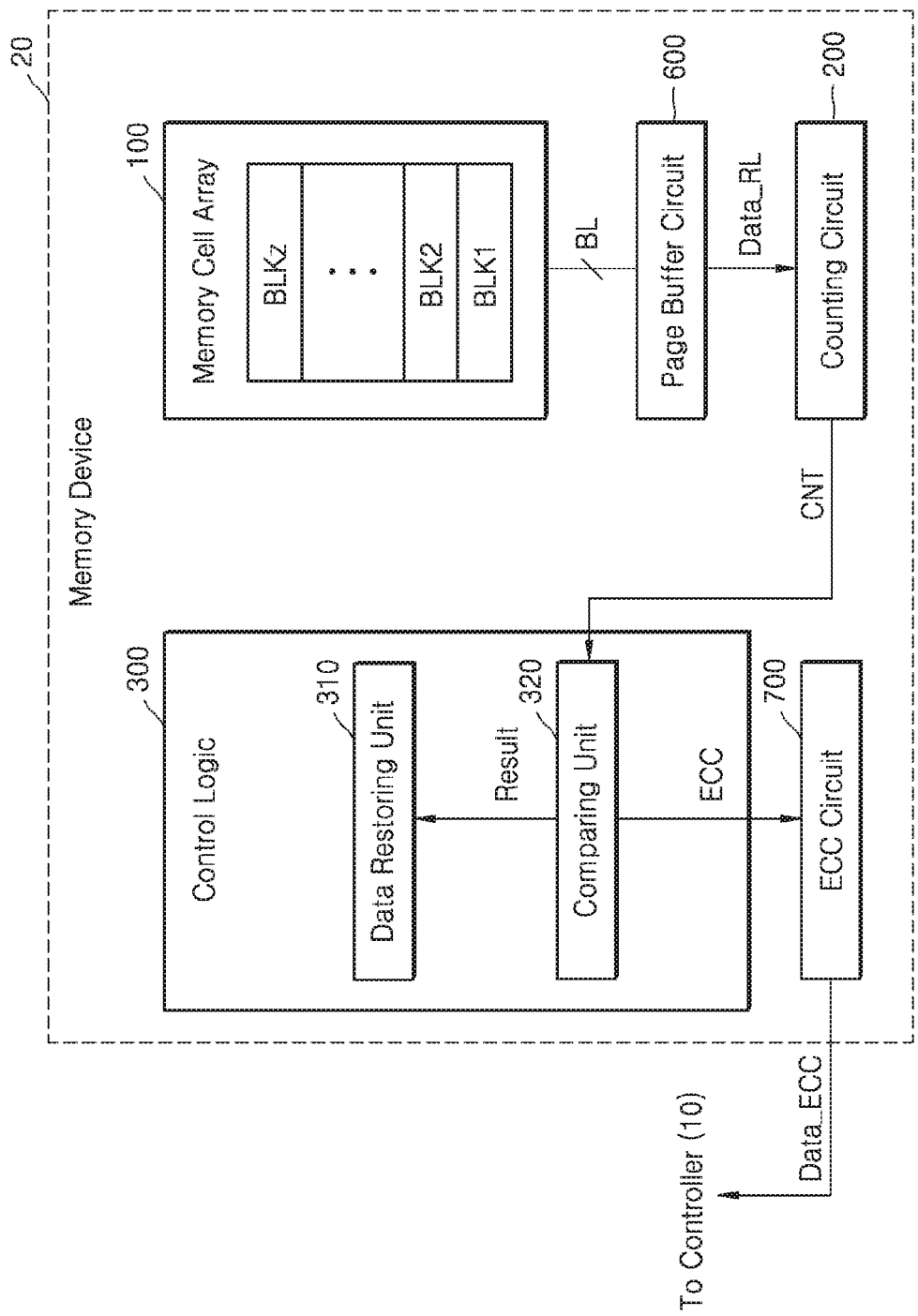
FIG. 20 is a block diagram of a memory device according to at least some example embodiments of the inventive concepts.

FIG. 20 is a block diagram of a memory device according to at least some example embodiments of the inventive concepts. Description of details provided above with reference to FIG. 3 will be omitted here.

Referring to FIG. 20, the memory device 20 may further include an error correcting code (ECC) circuit 700. The comparing unit 320 may compare a counting result CNT received from the counting circuit 200 with a reference value Ref, and when the counting result CNT is smaller than the reference value Ref, an error correction command ECC may be transmitted to the ECC circuit 700 as a result of comparing. Then the ECC circuit 700 may perform ECC on data and output the error-corrected data Data_ECC to the memory controller 10.

Figure 21:
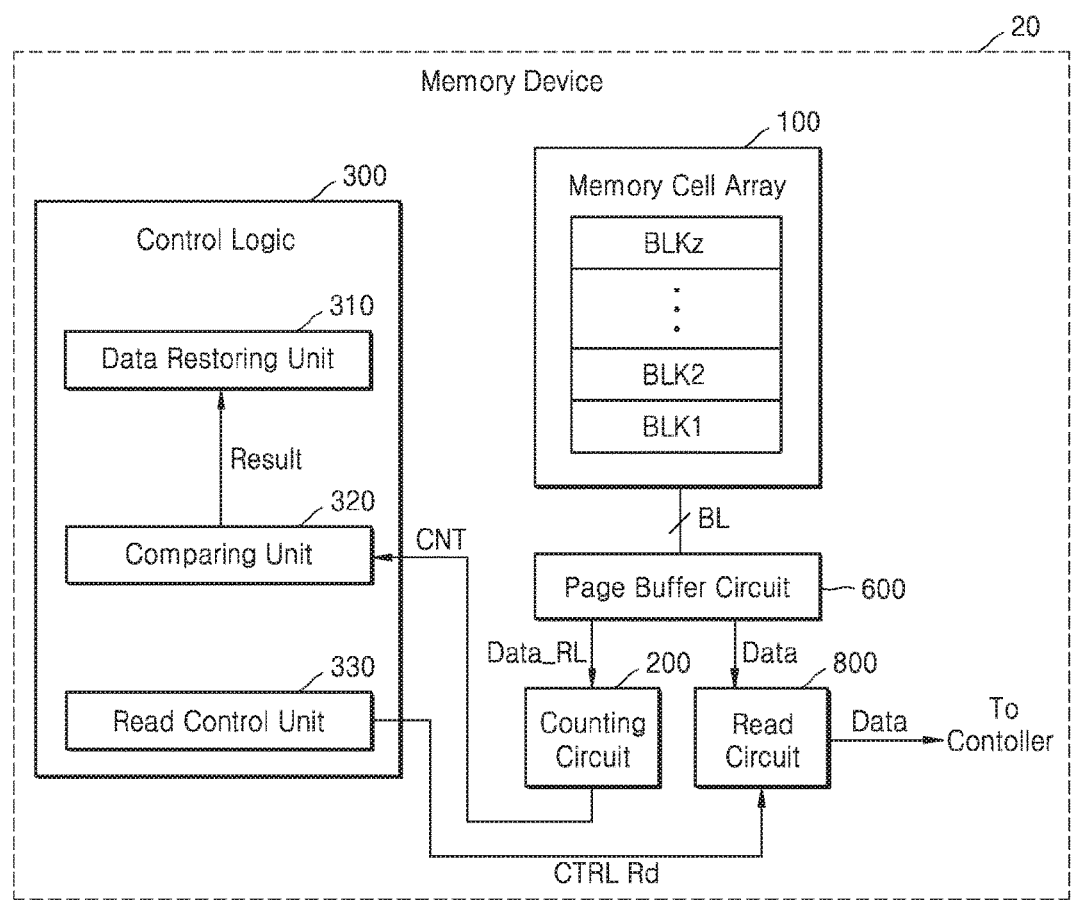
FIG. 21 is a block diagram of a memory device according to at least some example embodiments of the inventive concepts.

FIG. 21 is a block diagram of a memory device according to at least some example embodiments of the inventive concepts. Description of details provided above with reference to FIG. 3 will be omitted here.

Referring to FIG. 21, the memory device 20 may further include a read circuit 800. The control logic 300 may further include a read control unit 330. In parallel with the data storing unit 310 performing a restoration algorithm based on a comparison result Result, the memory device 20 may perform reading on subsequent data Data besides data on which restoration is being performed. When another read command of the memory controller 10 is transmitted to the memory device 20, the read control unit 330 may transmit a read control signal CTRL_Rd to the read circuit 800, and the read circuit 800 may transmit subsequent data Data to the memory controller 10.

Figure 22A:
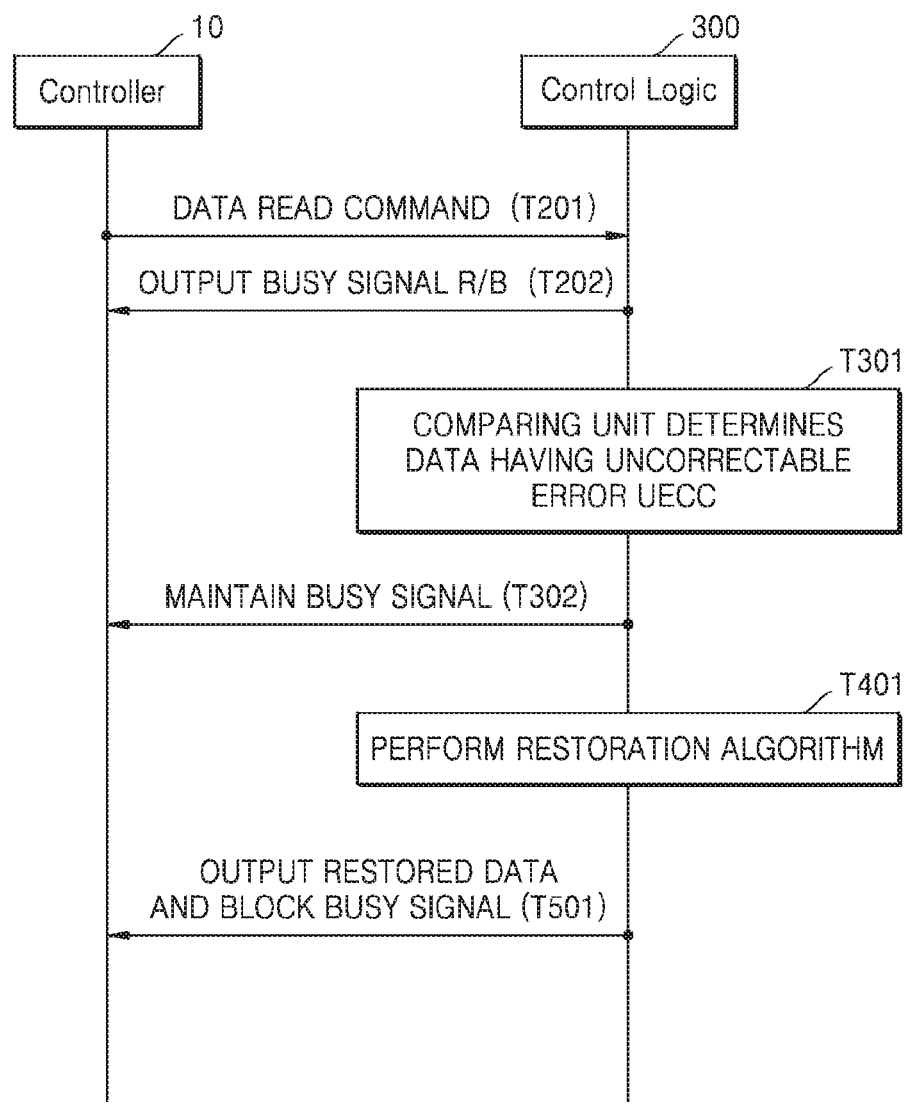
FIG. 22A illustrates operations of a data restoring method performed by elements of a memory system as time elapses, according to at least some example embodiments of the inventive concepts.

FIG. 22A illustrates operations of a data restoring method performed by elements of the memory system as time elapses, according to at least some example embodiments of the inventive concepts. The method will be described with reference to FIGS. 3 and 22A.

Referring to FIG. 22A, when a data read command is transmitted from the memory controller 10 to the control logic 300 in the memory device 20 in operation T201, the control logic 300 may output a busy signal R/B to the memory controller 10 in operation T202. That is, a busy signal R/B may be converted from logic low to logic high. As described above, when a result of determining an uncorrectable error is transmitted from the comparing unit of the control logic 300 to the data restoring unit 310 in operation T301, the control logic 300 may maintain the busy signal R/B as logic high in operation T302. If errors are correctable, the busy signal R/B may be converted from logic high to logic low (not shown). In the case of an uncorrectable error, the data restoring unit 310 of the control logic 300 may perform a restoration algorithm in operation T401. When data restoration is completed using the restoration algorithm, the control logic 300 may output the restored data and block the busy signal R/B in operation T501. That is, the busy signal R/B may be converted from logic high to logic low.

Figure 22B:
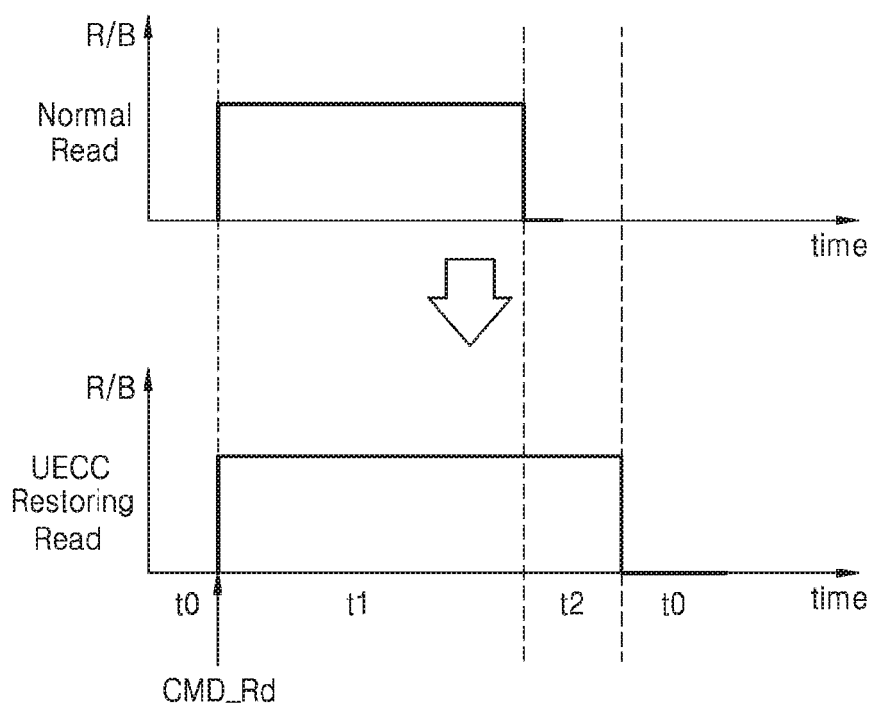
FIG. 22B is a graph showing an operation of a memory device according to at least some example embodiments of the inventive concepts.

FIG. 22B is a graph showing an operation of a memory device according to at least some example embodiments of the inventive concepts. Description of details provided with reference to FIG. 22A will be omitted here.

FIG. 22B is a graph showing an operation of the busy signal R/B of FIG. 22A. In a normal read operation Normal Read (NR), when a read command CMD_Rd is transmitted from the memory controller 10 to the memory device 20 in a standby state t0, the control logic 300 may convert the busy signal R/B from logic low to logic high and transmit the busy signal R/B to the memory controller 10. When a data read processing state t1 is completed, the control logic 300 converts the busy signal R/B again from logic high to logic low and transmit the busy signal R/B to the memory controller 10 so that the memory controller 10 may send another read command.

In a UECC Restoring Read (URR), when the memory controller 10 transmits a read command CMD_Rd to the memory device 20 in a standby state t0, the control logic 300 may convert the busy signal R/B from logic low to logic high and transmit the busy signal R/B to the memory controller 10. However, unlike in the normal read operation, in the UECC Restoring Read, even when the read processing state t1 is ended, a data restoring state t2 continues, and thus, the control logic 300 may maintain the busy signal R/B at logic high. When the data restoring state t2 is ended and the control logic 300 enters the standby state t0 again, the control logic 300 may convert the busy signal R/B from logic high to logic low and transmit the busy signal R/B to the memory controller 10 so that the memory controller 10 may send another read command.

Figure 23:
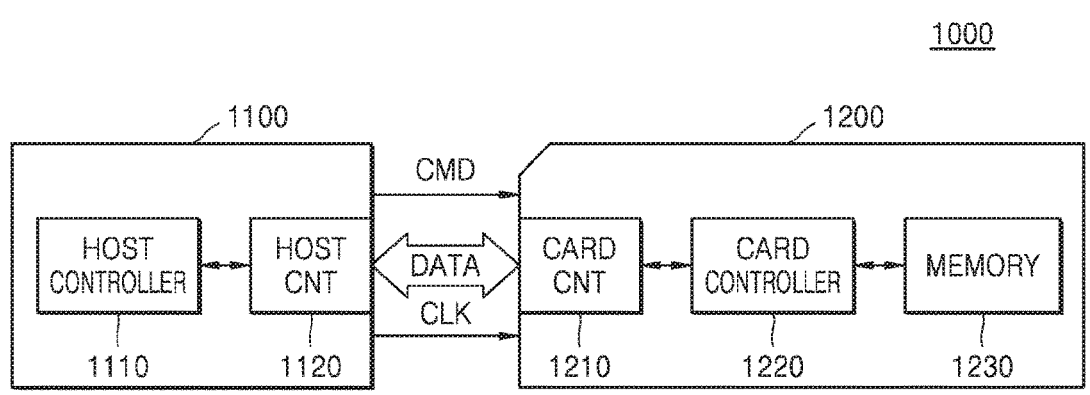
FIG. 23 is a block diagram illustrating a memory card system according to at least some example embodiments of the inventive concepts.

FIG. 23 is a block diagram illustrating a memory card system 1000 according to at least some example embodiments of the inventive concepts.

Referring to FIG. 23, the memory card system 1000 may include a host 1100 and a memory card 1200. The host 1100 may include a host controller 1110 and a host connector 1120. The memory card 1200 may include a card connector 1210, a card controller 1220, and a memory device 1230. The memory card 1200 may be implemented according to the embodiments illustrated in FIGS. 1 through 22B.

In detail, the memory card 1200 may determine whether errors are correctable based on degraded cells DC degraded during a read operation on memory cells. In the case of data having an uncorrectable error, the memory device 1230 in the memory card 1200 may restore data by using a predetermined or, alternatively, desired restoration algorithm. As data restoration is performed inside the memory device 1230 without involvement of the card controller 1220, reliability may be increased and performance may be improved.

The memory card 1200 may be configured to communicate with the host 110 through at least one of various interface protocols such as USB, MMC, PCI-E, ATA, Serial-ATA, Parallel-ATA, SCSI, Enhanced Small Device Interface (ESDI), and Integrated Drive Electronics (IDE).

The host 1100 may write data to the memory card 1200 or read data stored in the memory card 1200. The host controller 1110 may transmit a clock signal CLK and data DATA generated in a clock generator (not shown) in the host 1100 to the memory card 1200 through a host connector 1120.

The card controller 1220 may respond to a command received through the card connector 1210 to store data in the memory device 1230 in synchronization with a clock signal generated in a clock generator (not shown) in the card controller 1220. The memory device 1230 may store data received from the host 1100.

The memory card 1200 may be implemented as a Compact Flash Card (CFC), a Microdrive, a Smart Media Card (SMC), a Multimedia Card (MMC), a Security Digital Card (SDC), a memory stick, and a USB flash memory driver or the like.

Figure 24:
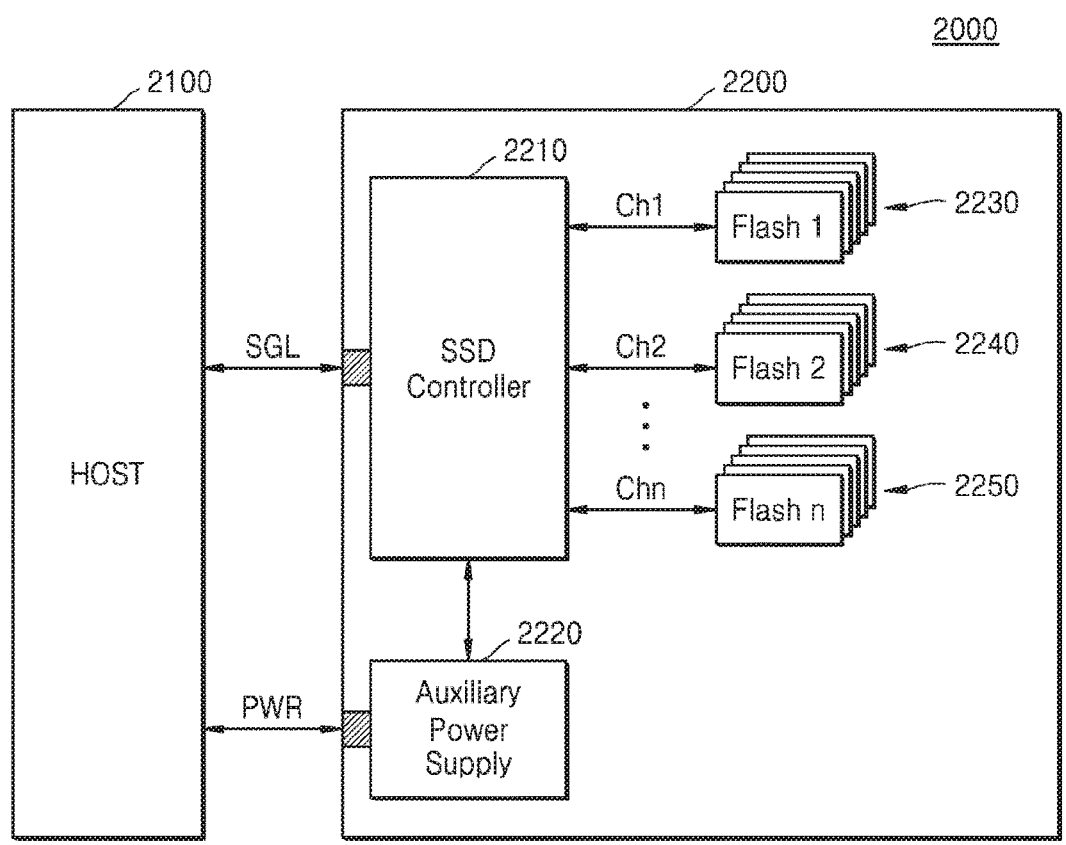
FIG. 24 is a block diagram illustrating a solid state disk (SSD) system according to at least some example embodiments of the inventive concepts.

FIG. 24 is a block diagram illustrating a solid state disk (SSD) system 2000 according to at least some example embodiments of the inventive concepts.

Referring to FIG. 24, the SSD system 2000 may include a host 2100 and an SSD 2200. The SSD 2200 may transmit or receive signal to or from the host 2100 via a signal connector, and receive power through a power connector. The SSD 2200 may include an SSD controller 2210, an auxiliary power supply 2220, and a plurality of memory devices 2230, 2240, and 2250. The SSD 2200 may be implemented according to the embodiments illustrated in FIGS. 1 through 23.

In detail, the plurality of memory devices 2230 through 2250 may determine whether errors are correctable based on degraded cells DC generated during a read operation on memory cells. Also, data having an uncorrectable error may be restored using a predetermined or, alternatively, desired restoration algorithm in a memory device among the plurality of memory devices 2230 through 2250. As data restoration is performed inside a memory device without involvement of a controller in the plurality of the memory devices 2230 through 2250, reliability may be increased and performance may be improved.

The memory card, the non-volatile memory device, the card controller according to at least one example embodiment of the inventive concepts may be housed in any of a variety of different package types. For example, a flash memory device and/or a memory controller according to at least one example embodiment of the inventive concepts may be housed in a Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A memory device comprising:
a memory cell array including a plurality of memory cells;
a counting circuit configured to obtain a counting result by performing a counting operation on data read from the plurality of memory cells; and
a control logic configured to perform a data restoring operation based on the counting result without involvement of a memory controller,
wherein the control logic is configured to,
generate a comparison result by comparing the counting result with a reference value to determine whether errors in the plurality of memory cells are correctable,
perform a restoration algorithm for the data restoring operation based on the comparison result,
output a ready/busy signal to the memory controller, and
maintain the ready/busy signal in a busy state during the data restoring operation.

2. The memory device of claim 1, wherein the counting circuit is configured to count a number of memory cells belonging to a distribution region between a first read level and a second read level based on first data and second data, the first data being data read based on the first read level, the second data being data read based on the second read level.

3. The memory device of claim 2, wherein the counting result matches a number of degraded cells of the memory cell array.

4. The memory device of claim 1, wherein the control logic determines whether errors in the plurality of memory cells are correctable without performing error correcting code (ECC).

5. The memory device of claim 4, wherein the control logic is configured to,
compare the counting result with a first reference value, and
if the counting result is greater than the first reference value,
determine errors of the plurality of memory cells are uncorrectable, and
perform the data restoring operation based on the determining that errors of the plurality of memory cells are uncorrectable.

6. The memory device of claim 5, wherein the control logic is configured to perform, as the data restoring operation, at least one of a data recover read operation and a soft decision data generating operation.

7. The memory device of claim 6, wherein the data read from the plurality of memory cells is data read according to a normal read operation performed on a first page, and
the control logic is configured to perform the data recover read operation by,
reading data of a second page adjacent to the first page,
determining a read voltage by setting a level of the read voltage based on a result of reading the data of the second page, and
re-reading data of the first page using the determined read voltage.

8. The memory device of claim 4, wherein the control logic is configured to,
compare the counting result with a first reference value and a second reference value that is greater than the first reference value,
perform the data restoring operation when the counting result is greater than the first reference value and not greater than the second reference value, and
output, to the memory controller, information indicating that errors of the plurality of memory cells are uncorrectable, when the counting result is greater than the second reference value.

9. The memory device of claim 1,
wherein control logic is configured to perform first and second read operations based on first and second read voltage levels, respectively, and
wherein the memory device further comprises:
a page buffer configured to,
store first data according to the first read operation and second data according to the second read operation,
perform an arithmetic operation on the first and second data, and
provide a result of the arithmetic operation to the counting circuit as the read data.

10. A memory system comprising:
a memory device comprising a memory cell array including a plurality of memory cells, a counting circuit configured to obtain a counting result by performing a counting operation on data read according to a normal read operation, and a control logic configured to perform a data restoring operation based on the counting result; and
a memory controller configured to control the memory device,
wherein the memory device outputs a ready/busy signal to the memory controller, and maintains a busy state based on the counting result, during a first section after the normal read operation.

11. The memory system of claim 10, wherein the first section includes a section during which the data restoring operation is performed.

12. The memory system of claim 10 wherein,
the plurality of memory cells have multiple threshold voltage states, and
the memory device is configured to perform a first read operation based on a first read level and a second read operation based on a second read level to determine any one of the threshold voltage states, and
the counting circuit is configured to count a number of memory cells having a threshold voltage between the first read level and the second read level.

13. The memory system of claim 12, wherein the control logic is configured to compare the counting result with a reference value, and perform a restoration algorithm for the data restoring operation regardless of a command from the memory controller based on a comparison result.

14. The memory system of claim 10, wherein the control logic is configured to perform the data restoring operation by performing at least one of a data recover read operation and a soft decision data generating operation.

15. A memory system comprising:
a memory device including a plurality of nonvolatile memory cells; and
a memory controller, the memory controller configured to send the memory device a read command, the memory device configured to respond to the read command by, designating cells, from among the plurality of nonvolatile memory cells, having threshold voltages within one or more first threshold voltage distribution regions as degraded cells, determining a total number of the degraded cells, determining whether a number of errors in the plurality of memory cells exceeds an error threshold based on the determined total number and a first threshold value, and performing a data restoring operation in response to determining that the number of errors in the plurality of memory cells exceeds the error threshold, wherein the data restoring operation is performed if an uncorrectable error is generated, and wherein the memory device configured to output a ready/busy signal to the memory controller, and maintain a busy state during the data restoring operation.

16. The memory system of claim 15, wherein the memory device is configured to perform, as the data restoring operation, at least one of a data recover read operation and a soft decision data generating operation.

* * * * *